(12) United States Patent
Hong et al.

(10) Patent No.: US 8,003,192 B2
(45) Date of Patent: Aug. 23, 2011

(54) NANODEVICE COMPRISING A NANOROD AND METHOD FOR MANUFACTURING THE SAME

(75) Inventors: Young-Joon Hong, Yongin-shi (KR); Gyu-Chul Yi, Pohang (KR)

(73) Assignee: LG Display Co., Ltd., Seoul (KR)

( * ) Notice: Subject to any disclaimer, the term of this patent is extended or adjusted under 35 U.S.C. 154(b) by 657 days.

(21) Appl. No.: 12/105,772

(22) Filed: Apr. 18, 2008

(65) Prior Publication Data

US 2009/0068411 A1    Mar. 12, 2009

(30) Foreign Application Priority Data

Sep. 11, 2007 (KR) .......................... 10-2007-0092187

(51) Int. Cl.
*B32B 3/00* (2006.01)
*B29D 11/00* (2006.01)

(52) U.S. Cl. .............. 428/120; 117/84; 117/87; 117/88; 117/106; 117/920; 257/615; 428/119

(58) Field of Classification Search .................. 428/120, 428/119; 117/284, 84, 87, 88, 106, 920; 257/615

See application file for complete search history.

(56) References Cited

U.S. PATENT DOCUMENTS

2005/0235904 A1* 10/2005 Lee et al. ..................... 117/84
2008/0036038 A1*  2/2008 Hersee et al. ................ 257/615

FOREIGN PATENT DOCUMENTS

| JP | 2005-277182 A  | 10/2005 |
| KR | 10-2006-0107107 | 10/2006 |
| KR | 10-2006-0107108 | 10/2006 |
| KR | 10-2006-0117692 | 11/2006 |

OTHER PUBLICATIONS

Hong et al., "Selective growth of ZnO nanorods on Si substrates using facet-controlled GaN micropatterns," The Korean Physical Society, 2007 Spring Conference K-11[15], Apr. 20, 2007.

* cited by examiner

*Primary Examiner* — Brent T O'Hern
(74) *Attorney, Agent, or Firm* — Birch, Stewart, Kolasch & Birch, LLP

(57) ABSTRACT

A nanodevice including a nanorod and a method for manufacturing the same is provided. The nanodevice according to an embodiment of the present invention includes i) a substrate; ii) at least one crystal that is located on the substrate and includes a plurality of side surfaces forming an angle with each other; and iii) at least one nanorod that is located on the crystal and extends along a direction that is substantially perpendicular to a surface of the substrate.

16 Claims, 30 Drawing Sheets

NANODEVICE COMPRISING A NANOROD AND METHOD FOR MANUFACTURING THE SAME

CROSS-REFERENCE TO RELATED APPLICATION

This application claims priority to and the benefit of Korean Patent Application No. 10-2007-0092187 filed in the Korean Intellectual Property Office on Sep. 11, 2007, the entire contents of which are incorporated herein by reference.

BACKGROUND (a) Field of the Invention

The present invention relates to a nanodevice and a method for manufacturing the same. More specifically, the present invention relates to a nanodevice including a nanorod that is manufactured at a desired position using a pattern of a crystal having an anisotropic surface energy and a method for manufacturing the same.

(b) Description of the Related Art

Since a nanorod has a great length to width ratio, it can be manipulated much easier than a nanodot or a quantum dot. In addition, the nanorod not only has a large surface area but also has a good crystal property, and thereby it has been spotlighted as a material to be applicable to a semiconductor, a light emitting element, an environmental material, a sensor, and so on.

Generally, the nanorod is manufactured by using a metal catalyst. When the metal catalyst is used, a precursor is melted to be precipitated, and then the nanorod is formed. When the nanorod is formed by using the metal catalyst, there is a possibility that the metal catalyst functions as a contaminating source when the nanorod with a high purity and quality is manufactured since the nanorod that is formed as a precursor is melted in a metal catalytic liquid droplet to be precipitated ahead of a reaction of the desired nanorod materials. A conventional technique of manufacturing a semiconductor nanorod has a limitation in various applications of the semiconductor nanorod since it is difficult to freely control electric conductivity and optical property of the semiconductor nanorod due to the contamination. Also, since the growing speed of the diameter and length of the nanorod depends on the size of the metal catalyst liquid droplet, it is not easy to form a nanorod with a uniform diameter and length and with a good shape by using a method for manufacturing a nanorod with the metal catalyst.

SUMMARY

A nanodevice provided with a nanorod with a uniform size that is selectively grown at a desired location is provided.

In addition, a method for manufacturing the above nanodevice is provided.

A nanodevice according to an embodiment of the present invention includes i) a substrate; ii) at least one crystal that is located on the substrate and includes a plurality of side surfaces forming an angle with each other; and iii) at least one nanorod that is located on the crystal and extends along a direction that is substantially perpendicular to a surface of the substrate.

A cross-section of the crystal cutting along a direction to be parallel to the surface of the substrate may become smaller moving closer to the nanorod. An average cross-sectional area of the crystal cutting along a direction that is parallel to the surface of the substrate may not be less than a cross-sectional area of the nanorod cutting along a direction that is parallel to the surface of the substrate.

The at least one crystal may include a plurality of crystals, and the plurality of crystals are spaced apart from each other. The plurality of crystals may be arranged along one direction, and a distance between crystals neighboring each other among the plurality of crystals along one direction is substantially the same.

The nanodevice according to an embodiment of the present invention may further include a seed layer that is located between the substrate and the crystal, and the seed layer and the substrate may contain the same material. The crystal may be grown from the seed layer. The nanodevice according to an embodiment of the present invention may further include a mask layer covering the seed layer, and the mask layer may have a plurality of openings and the crystal is formed to cover the openings.

At least one side surface among the plurality of side surfaces may be a slanted surface. A shape of the crystal may be a frustum of a pyramid or a pyramid. The slanted surface may form an angle of a range from about 10 to 90 degrees with the surface of the substrate. The nanorod may extend along a center axis of the crystal.

Angles formed when the side surfaces neighboring each other among the plurality of side surfaces meet with each other may be substantially the same. The plurality of side surfaces may extend along a direction that is substantially perpendicular to the surface of the substrate, and the crystal may include an upper surface that neighbors the plurality of side surfaces and is substantially parallel to the surface of the substrate. The at least one nanorod may include a plurality of nanorods, and the plurality of nanorods may be formed on the upper surface. Numbers of the side surfaces are in a range from 3 to 612.

Growing directions of the crystal and the nanorod may be substantially the same. The nanodevice may be used as a light emitting element, an electron emitting element, a diode, or a transistor.

The nanorod may include at least one element selected from the group consisting of zinc oxide (ZnO), zinc magnesium oxide (ZnMgO), zinc cadmium oxide (ZnCdO), zinc beryllium oxide (ZnBeO), and zinc magnesium beryllium oxide (ZnMgBeO). The crystal may include at least one element selected from the group consisting of silicon, aluminum oxide, gallium arsenide, spinner, indium phosphide, gallium phosphide, aluminum phosphide, gallium nitride, indium nitride, aluminum nitride, zinc oxide, magnesium oxide, silicon carbide, and titanium oxide.

A method for manufacturing a nanodevice according to an embodiment of the present invention includes i) providing a substrate; ii) providing at least one crystal including a plurality of side surfaces forming an angle with each other on the substrate; and iii) providing at least one nanorod that extends along a direction to be substantially perpendicular to a surface of the substrate on the crystal.

A method for manufacturing a nanodevice according to an embodiment of the present invention may further include i) providing a seed layer on the substrate; ii) providing a mask layer on the seed layer; and iii) forming a plurality of openings in the mask layer. The crystal may be provided to cover the opening on the seed layer during the providing of the at least one crystal. The crystal may be grown to penetrate the opening from the seed layer during the providing of the at least one crystal.

A growing direction of the nanorod may be substantially the same as a growing direction of the crystal during the providing of the nanorod.

According to an embodiment of the present invention, a nanorod with a uniform diameter and length can be selectively grown at a desired location. Therefore, an interval between the nanorods can be controlled, and thereby an integration degree of the nanorod is enhanced and a large amount of the nanorods can be produced. In addition, since a metal catalyst is not used, a lesser-contaminated nanorod with high purity and high quality can be produced. Also, since a large amount of nanorods are perpendicularly oriented on a desired location, a large amount of various nanorods can be produced.

DETAILED DESCRIPTION OF THE EMBODIMENTS

Figure 1:
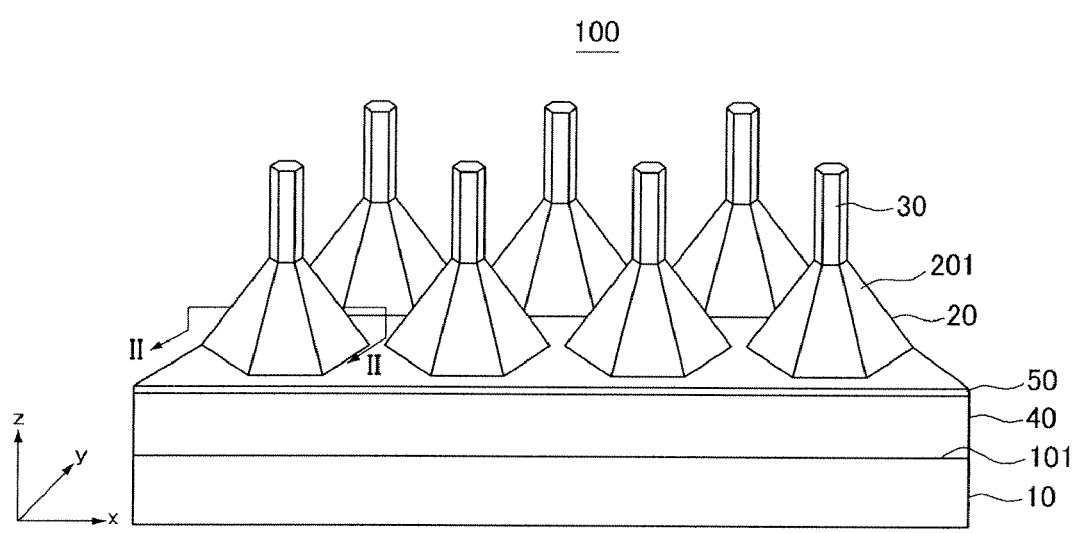
FIG. 1 is a schematic perspective view of a nanodevice according to a first embodiment of the present invention.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper", "over", and the like may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein are interpreted accordingly.

All terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to perspective views that are schematic illustrations of idealized embodiments of the present invention. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. As an example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Embodiments of the present invention are explained below with reference to FIGS. 1 to 15. The embodiments are merely to illustrate the present invention and the present invention is not limited thereto.

FIG. 1 schematically illustrates a nanodevice 100 according to a first embodiment of the present invention. The nanodevice 100 shown in FIG. 1 is so small to be nano-scaled. Therefore, the nanodevice 100 is enlarged to be shown in FIG. 1.

As illustrated in FIG. 1, the nanodevice 100 includes a substrate 10, a crystal 20, and a nanorod 30. In addition, the nanorod 100 may further include a seed layer 40 and a mask layer 50.

Single crystal sapphire, gallium arsenide, spinner, silicone, silicone carbide, indium phosphide, amorphous quartz, or firex can be used as a material of the substrate 10. When a substrate 10 made of a single crystal is used, various application devices can be manufactured since the manufacturing cost of the nanodevice 100 is low, and a substrate with a large area can be used and electric conductivity can be easily controlled.

A seed layer 40 is located on the substrate 10. Although the nanodevice 100 is drawn to include a seed layer 40 in FIG. 1, the seed layer 40 can be omitted. The seed layer 40 acts as a basic thin film for making a crystal 20. Silicon, aluminum oxide, gallium arsenide, spinner, indium phosphide, gallium phosphide, aluminum phosphide, gallium nitride, indium nitride, aluminum nitride, zinc oxide, magnesium oxide, silicon carbide, and titanium oxide can be used as a material of the seed layer 40. When the crystal 20 grows from the seed layer 40, the material of the crystal 20 can be the same as that of the seed layer 40.

A mask layer 50 is located on the seed layer 40. Although the nanodevice 100 is drawn to include the mask layer 50 in FIG. 1, the mask layer 50 may be omitted. A crystal 20 can be regularly formed on a desired position of the substrate 10 without using the mask layer 50.

As illustrated in FIG. 1, a plurality of crystals 20 are spaced apart from each other. Since the plurality of crystals 20 are regularly formed to be spaced apart from each other, a nanodevice 100 with a high integration degree can be manufactured. The crystals 20 are manufactured to be grown on an opening 501 (shown in FIG. 2) of the mask layer 50.

The crystals 20 include a plurality of side surfaces forming an angle. The crystal 20 has a shape of a hexagonal frustum of a pyramid or a pyramid including the side surfaces 201. The angles formed between the plurality of side surfaces 201 are substantially the same. Therefore, the crystal 20 has an equilateral cone shape, and then a nanorod 30 is formed on an upper end of the equilateral cone.

As shown in FIG. 1, the crystals 20 are arranged along one direction, that is, an x-axis direction or a y-axis direction. A plurality of crystals 20 are regularly arranged along the x-axis direction or the y-axis direction. Therefore, a distance between crystals 20 neighboring each other among the plurality of crystals 20 is substantially the same. As a result, since a plurality of crystals 20 are formed with regularity, it is very easy to arrange the nanodevice 100.

The nanorod 30 is directly located on the crystal 20. The nanorod 30 is manufactured only on a certain surface of the crystal 20. The nanorod 30 can be manufactured by using zinc oxide (ZnO), zinc magnesium oxide (ZnMgO), zinc cadmium oxide (ZnCdO), zinc beryllium oxide (ZnBeO), and zinc magnesium beryllium oxide (ZnMgBeO). The nanorod 30 extends along a direction to be substantially perpendicular to a surface 101 of the substrate 10, that is, a z-axis direction.

Since a plurality of nanorods 30 extend along the z-axis direction side by side, it is very easy to manufacture the nanodevice 100.

Figure 2:
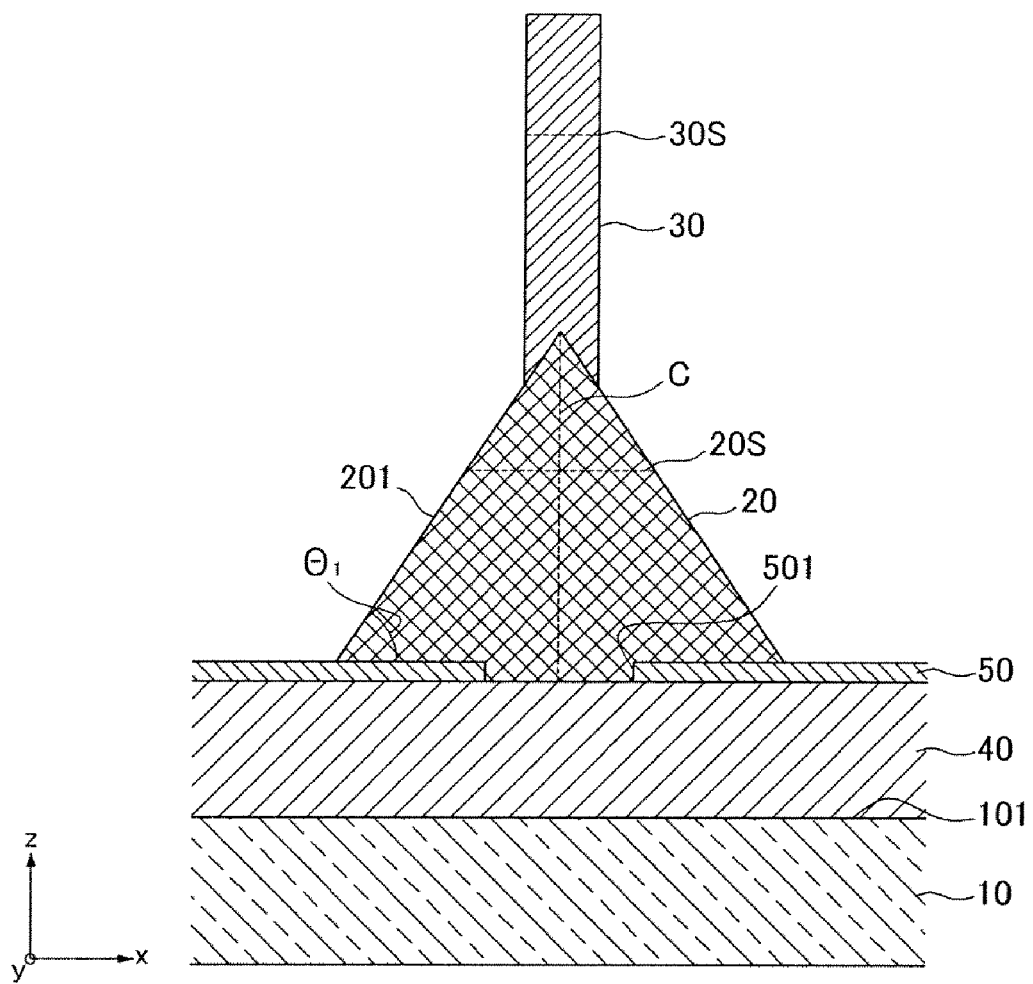
FIG. 2 is a cross-sectional view cutting along a line II-II of FIG. 1.

FIG. 2 illustrates a cross-section of the nanodevice 100 cutting along a line II-II of FIG. 1. As illustrated in FIG. 2, a mask layer 50 has a plurality of openings 501. Since the plurality of openings 501 are formed to have a uniform pattern to be spaced apart from each other, the crystal 20 and the nanorod 30 can be regularly formed on the substrate 10.

As illustrated in FIG. 2, the crystal 20 can grow from the seed layer 40 to be penetrated through the plurality of the openings 501. In this case, the seed layer 40 and the crystal 20 contain the same material. The crystal 20 is grown on the mask layer 50 to cover the opening 501. A cross-sectional area 20S, which is made by cutting the crystal 20 along a direction parallel to the surface 101 of the substrate 10, that is, a direction parallel to the xy plane, becomes smaller moving closer to the nanorod 30. The nanorod 30 is manufactured only on a certain surface of the crystal 20 or a vertex thereof. Therefore, the crystal 20 can stably support the nanorod 30.

As illustrated in FIG. 2, the plurality of side surfaces 201 are formed as slanted surfaces. The slanted surfaces form an angle $\theta_1$ with the surface 101 of the substrate 10. The angle $\theta_1$ is in a range of about 10 degrees to 90 degrees. If the angle $\theta_1$ is less than 10 degrees, the height of the crystal 20 is too little and the role of the crystal 20 is too insignificant. That is, this is the same as a situation in which the mask layer 50 supports the nanorod 30. On the contrary, it is impossible to form the crystal with the angle $\theta_1$ being more than 90 degrees.

Since the nanorod 30 extends along a center axis C of the crystal 20 according to an epitaxial relationship with the crystal 20, the nanorod 30 is firmly supported by the crystal 20. Therefore, the nanorod 30 can be stably manufactured.

Meanwhile, a cross-sectional area 20S of the crystal 20 becomes smaller moving closer to the nanorod 30. Furthermore, an average cross-sectional area 20S of the crystal 20 is larger than a cross-sectional area 30S of the nanorod 30. Therefore, the nanorod 30 can be stably supported. Here, the cross-sectional area means an area cutting along a direction parallel to a surface 101 of the substrate 10, that is, the xy plane direction.

Figure 3:
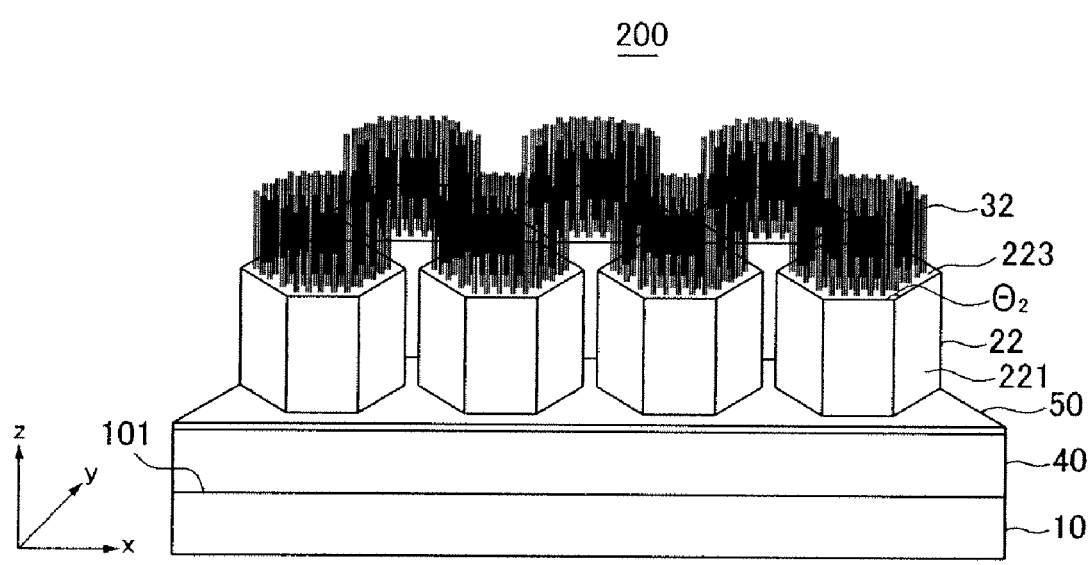
FIG. 3 is a schematic perspective view of a nanodevice according to a second embodiment of the present invention.

FIG. 3 schematically illustrates a nanodevice 200 according to a second embodiment of the present invention. The nanodevice 200 shown in FIG. 3 is so small to be nano-scaled. Therefore, the nanodevice 200 is enlarged to be shown in FIG. 3. Since the nanodevice 200 of FIG. 3 is the same as the nanodevice 100 of FIG. 1 except the crystal 22 and the nanorod 32, like elements are referred to by like reference numerals and detailed description thereof is omitted.

As illustrated in FIG. 3, the crystal 22 has a hexagonal column shape. The crystal 22 with the hexagonal column shape is formed on the mask layer 50 by using an organic metal chemical vapor deposition method. A plurality of nanorods 32 with a bundle shape are formed on the crystal 22. Since a plurality of nanorods 32 are formed along the z-axis direction side by side, it is very easy to manufacture the nanodevice 200.

The crystal 22 includes an upper surface 223 and a plurality of side surfaces 221. The upper surface 223 is substantially parallel to the surface 101 of the substrate 10 and neighbors the plurality of side surfaces 221. A plurality of nanorods 32 are formed on the upper surface 223. The plurality of side surfaces 221 extend along a direction to be perpendicular to the surface 101 of the substrate 10, that is, the z-axis direction.

As illustrated in FIG. 3, the crystal 22 includes six side surfaces 221. Although not shown in FIG. 3, number of side surfaces 211 of the crystal 22 can be three to six-hundred and twelve. The number of the side surfaces 211 can be variously controlled depending on process conditions. Angles $\theta_2$, which are formed when side surfaces neighboring each other among the plurality of side surfaces 221 meet together, are substantially the same. Therefore, a cross-section, which is made by cutting the crystal 22 along the xy plane direction, is substantially an equilateral hexagon.

Methods for manufacturing the nanodevice 100 according to a first embodiment of the present invention are explained below with reference to FIGS. 4 to 13. Here, FIG. 4 illustrates a flow chart of a method for manufacturing the nanodevice 100, while FIGS. 5 to 13 schematically illustrate processes of each step of methods for manufacturing the nanodevice 100.

Figure 4:
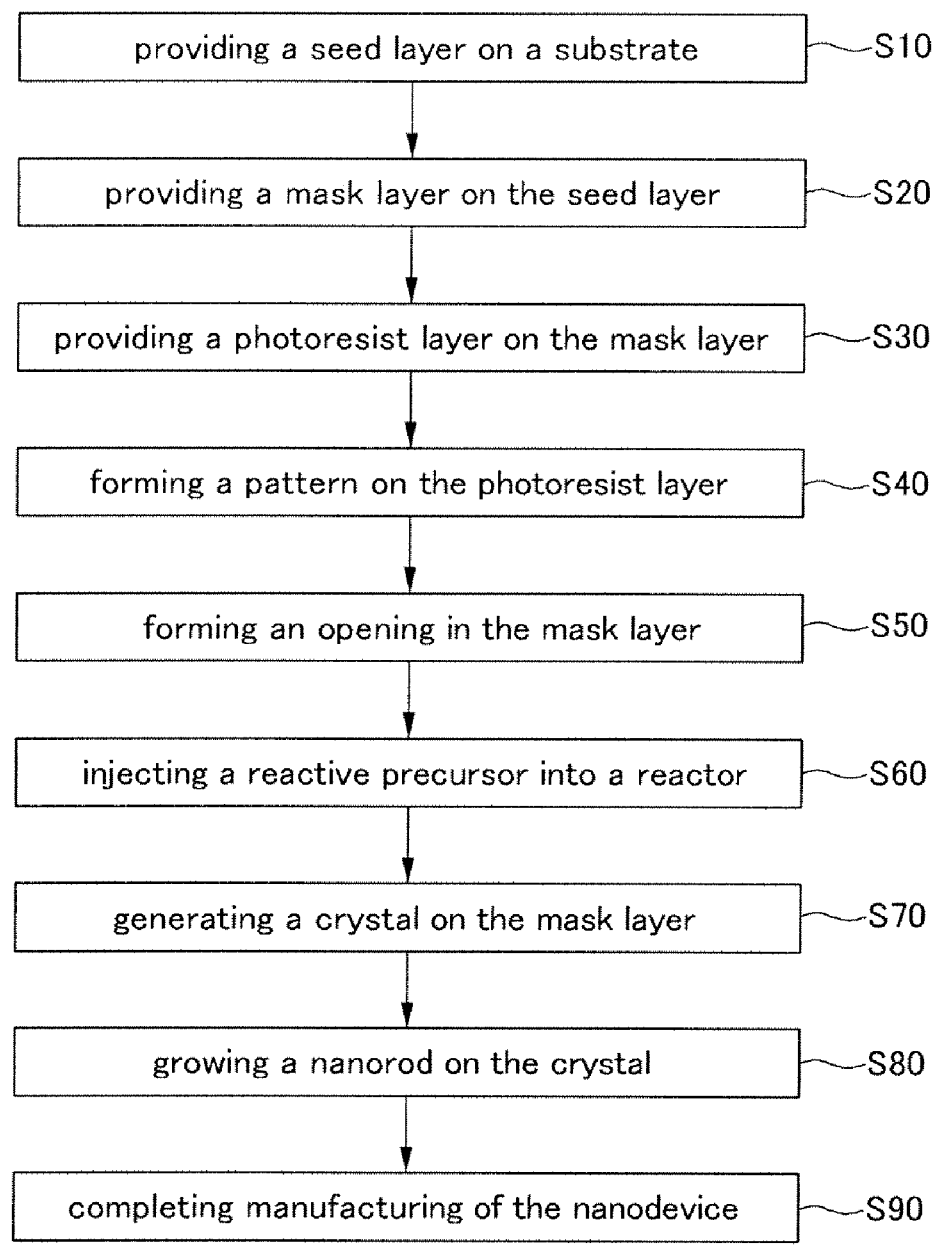
FIG. 4 is a schematic flow diagram schematically showing a method for manufacturing the nanodevice of FIG. 1.

FIG. 4 is a schematic flow chart showing a method for manufacturing a nanodevice 100 according to a first embodiment of the present invention.

As described in FIG. 4, the seed layer 40 with anisotropic surface energy is provided on the substrate 10 in the step S10. The seed layer 40 can be deposited on the substrate 10. A single crystal can be used as a material of the substrate 10, and the substrate 10 has a crystal plane of the (111) direction. Gallium nitride can be used as a material of the seed layer 40. A substrate 10 made of various materials can be used for controlling a crystal property of the seed layer 40. The substrate 10 can be manufactured into a single crystal form which is the same as the seed layer 40. The seed layer 40 can be deposited on the substrate 10 by using chemical vapor deposition (CVD), metal organic chemical vapor deposition (MOCVD), sputtering, electron beam evaporization, thermal evaporization, pulsed laser deposition, molecular beam epitaxy, chemical beam evaporization, or hydrothermal synthesis.

Figure 5:
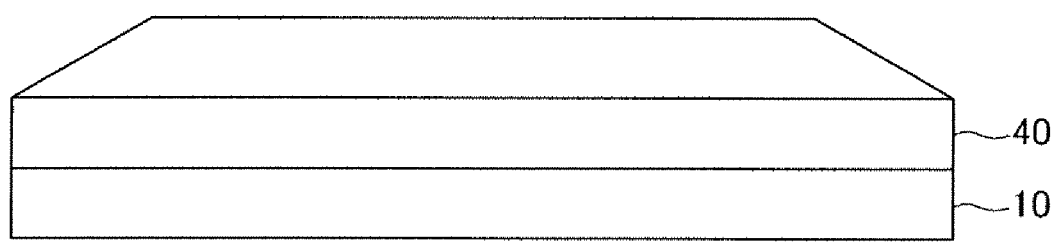
FIGS. 5 to 13 are schematic views of each process of the method for manufacturing the nanodevice of FIG. 1.

FIG. 5 schematically shows a step S10 of FIG. 4. As illustrated in FIG. 5, the seed layer 40 made of gallium nitride is formed on the substrate. If the crystal is epitaxially formed on the substrate 10 well, the seed layer 40 is not necessarily formed. Therefore, the step S10 may be omitted.

A mask layer 50 (shown in FIG. 5) is provided on the seed layer 40 for selectively growing a crystal in the step S20 as described in FIG. 4. The mask layer 50 can be formed by depositing silicon oxide on the seed layer 40. A width of the mask layer 50 may be in a range from an order of nanometers to an order of tens of micrometers. The mask layer 50 can be manufactured by using a material with a selectively growing property to the crystal.

Figure 6:
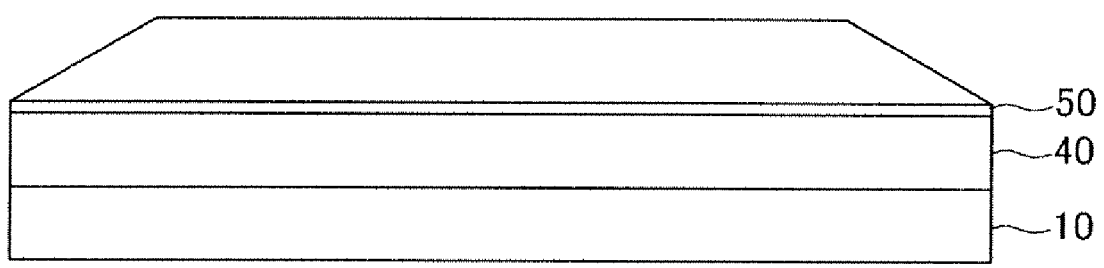

FIG. 6 schematically shows a step S20 of FIG. 4. As illustrated in FIG. 6, the mask layer 50 can be formed on the seed layer 40 by depositing silicon oxide.

Next, a photoresist layer 60 (shown in FIG. 7) is provided on the mask layer 50 in the step S30 as described in FIG. 4.

Figure 7:
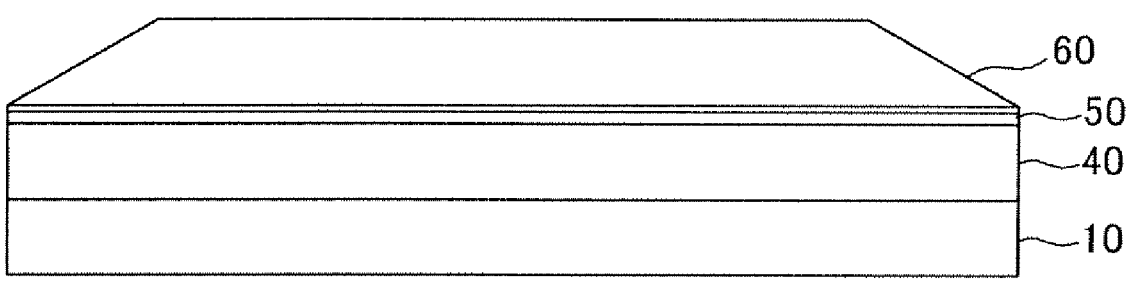

FIG. 7 schematically shows a state in which the photoresist layer 60 is attached to be on the mask layer 50. The photoresist layer 60 is coated on the mask layer 50 in order to form a desired pattern on the mask layer 50. The photoresist layer 60 can be made of a photosensitive resin.

Figure 8:
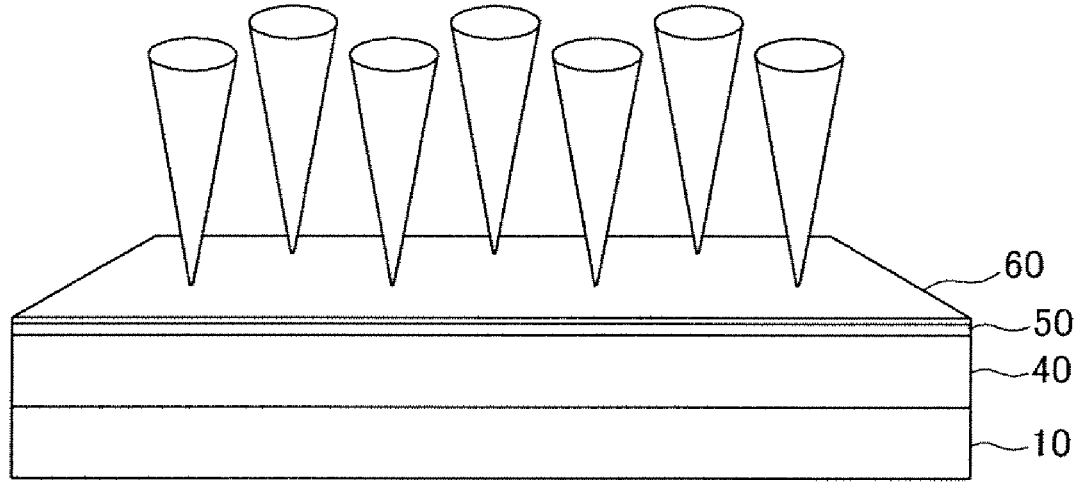

A pattern is formed on the photoresist layer 60 in the step S40 as described in FIG. 4. FIG. 8 shows a few processes for forming a pattern on the photoresist layer in the step S40.

As illustrated in FIG. 8, the photoresist layer 60 is etched by using light or an electron beam. Next, the mask layer 50 is exposed outside while the photoresist layer 60 is developed and then an etched portion of the photoresist layer 60 is removed. Again, the mask layer 50 is removed, and thereby an opening 501 (shown in FIG. 9) is partially formed on the mask layer 50 which is exposed outside. In this case, the mask layer 50 can be etched by using a physical etching method with plasma or a chemical etching method with a chemical liquid.

Figure 9:
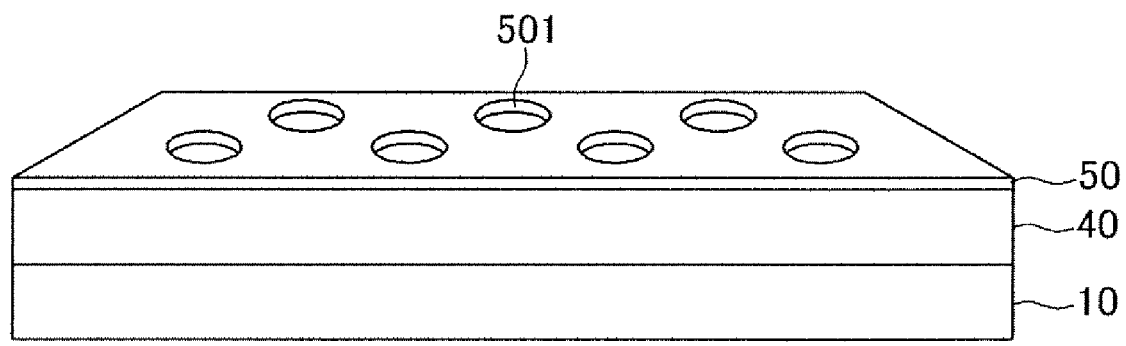

The opening 501 is formed on the mask layer 50 in the step S50 as described in FIG. 4. FIG. 9 shows a state in which the opening 501 is formed on the mask layer 50. If the photoresist layer 60 is melted by using an organic solvent, the mask layer 50 on which an opening 501 is formed is exposed outside. Again, as described above, the mask layer 50 is etched, and thereby the opening 501 (shown in FIG. 9) is partially formed in the mask layer 50 that is exposed outside.

Figure 10:
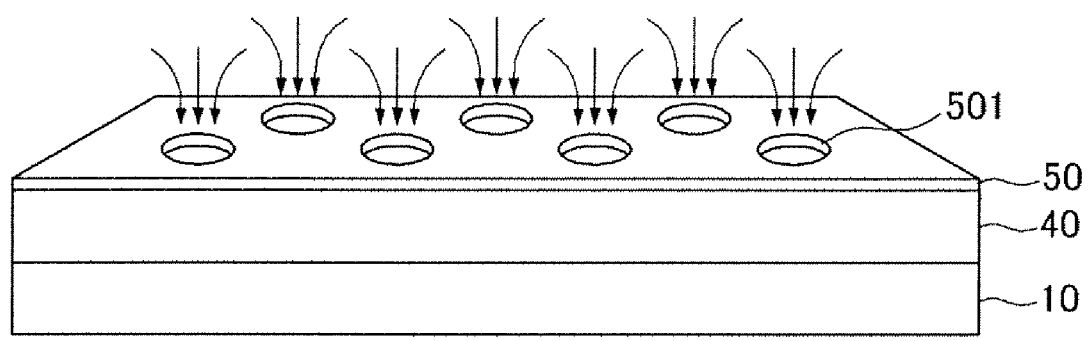

Next, a reactive precursor is injected into a reactor in the step S60 as described in FIG. 4. FIG. 10 shows a state in which a crystal with anisotropic surface energy is generated by the reactive precursor on the seed layer 40 that is exposed outside through the opening 501. The crystal only grows on the opening 501 due to the mask layer 50. Trimethyl gallium (TMGa) or ammonia ($NH_3$) is used as the reactive precursor. TMGa is transferred by using a transferring gas from one side while $NH_3$ is injected from the other side. Then, Ga of TMGa and N of $NH_3$ are reacted together to be grown as a crystal of GaN on the opening 501. The size and plane of the crystal are controlled while the crystal grows.

Figure 11:
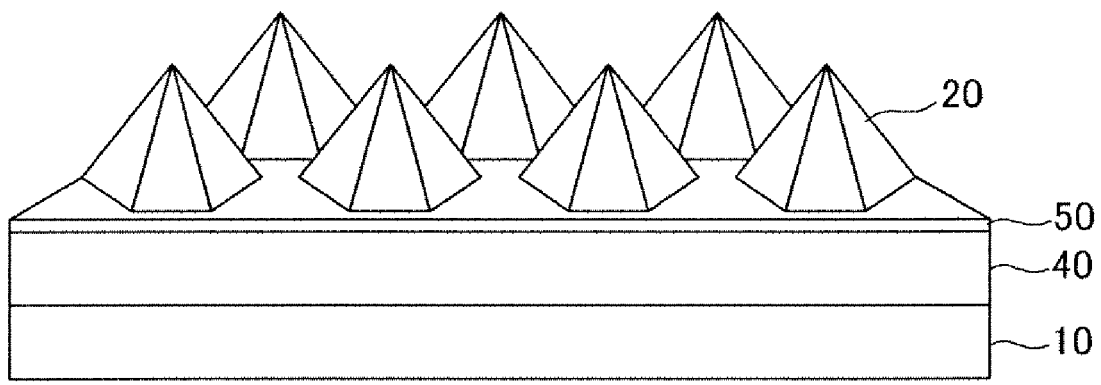

Next, the crystal 20 is formed on the mask layer 50 in the step S70 as described in FIG. 4. FIG. 11 shows a state in which the crystal 20 is grown on the mask layer 50. As illustrated in FIG. 11, a crystal 20 made of GaN with a hexagonal frustumpyramid is grown on the opening 501 (shown in FIG. 10). A crystal structure can be deformed into a hexagonal column or a hexagonal pyramid depending on a reacting condition. The crystal structure can be deformed by controlling the temperature and pressure in the reactor or a flux of the reactive precursor.

Figure 12:
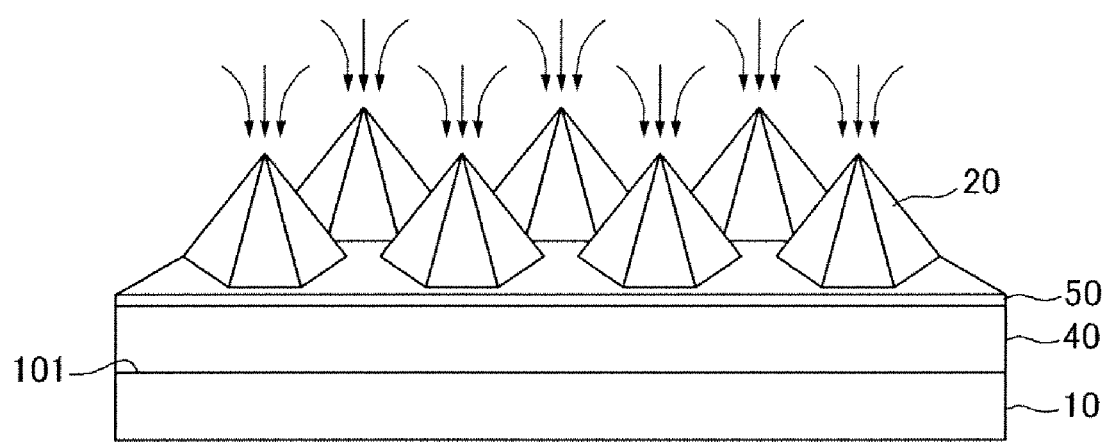

The nanorod is generated on the crystal 20 in the step S80 as described in FIG. 4. FIG. 12 shows a process of generating the nanorod on the crystal 20. Demethyl zinc (DEZn) and oxygen ($O_2$) as reactive precursors are injected into the reactor. Since the demethyl zinc acts as a zinc source, a nanorod made of a zinc oxide in which zinc and oxygen are combined is generated on the crystal 20. The nanorod 30 only grows on a certain plane of the crystal 20 with a selective growing property. The nanorod 30 can grow only on a certain plane of the crystal 20 by using anisotropic surface energy according to a plane of the crystal 20. A growing direction of the nanorod 30 is the same as that of the crystal 20. A plane of the crystal 20 on which the nanorod 30 selectively and vertically grows is controlled. Therefore, the nanorod 30 grows along a vertical direction of the surface 101 of the substrate 10.

A structure of the gallium nitride is the same as that of the zinc oxide and a $\{10\bar{1}0\}$ surface energy of the zinc oxide is lower than a $\{11\bar{2}0\}$ or $\{0001\}$ surface energy. Therefore, a method for growing a nanorod made of zinc oxide without using a catalyst depends on a great surface energy of the wurtzite crystal structure. The anisotropic property of the surface energy not only lets the nanorod made of zinc oxide grow along the [0001] direction but to also grow along the same crystallographic direction at each plane of the crystal made of gallium nitride. Therefore, the nanorod is voluntarily formed only on an upper plane of the hexagonal column with a $\{0001\}$ plane or an upper end of the hexagonal pyramid that corresponds to a lattice structure of the (0001) plane of the nanorod.

As described above, although the nanodevice provided with the crystal made of a gallium nitride and the nanorod made of zinc oxide may be manufactured, this is merely to illustrate the present invention and the present invention is not limited thereto. Therefore, a crystal and a nanorod can be manufactured by using other materials, respectively.

Figure 13:
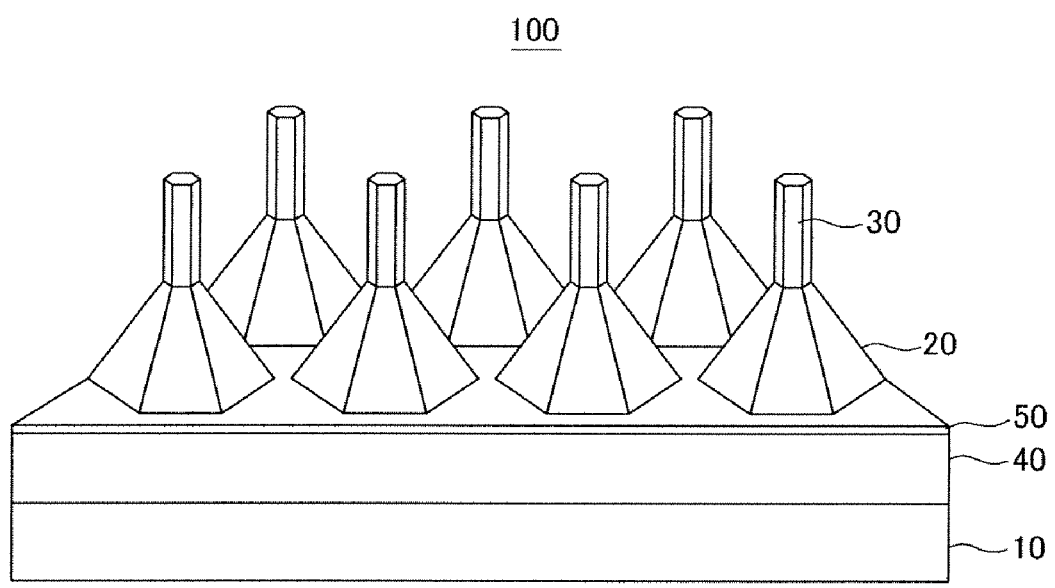

Finally, manufacturing of the nanodevice can be completed in the step S90 shown in FIG. 5. FIG. 13 illustrates the nanodevice 100 provided with the nanorod 30 grown on the crystal 20. As shown in FIG. 13, the nanorod 30 extending along a direction perpendicular to the surface 101 of the substrate 10 is formed on the crystal 20 with a hexagonal frustum-pyramid shape. A nanodevice according to a second embodiment of the present invention can be manufactured by using a similar method for manufacturing the above-described nanodevice according to a first embodiment of the present invention.

If a nanorod is manufactured by using a catalyst, the precursor is melted into a metal catalyst and then the nanorod is formed. Therefore, since the nanorod is contaminated by the catalyst, a nanorod with a desired property cannot be manufactured.

Figure 14:
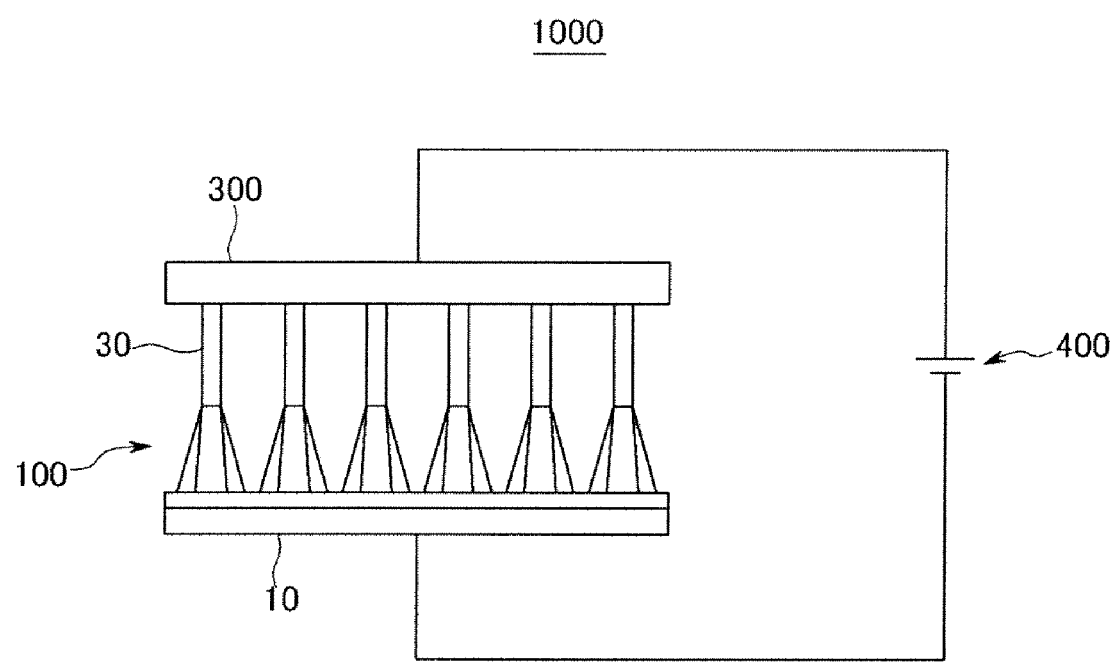
FIG. 14 is a schematic view of a light emitting device including the nanodevice of FIG. 1.

FIG. 14 schematically shows a light emitting element 1000 including the nanodevice 100 of FIG. 1. A structure of the light emitting element 1000 shown in FIG. 14 is merely to illustrate the present invention and the present invention is not limited thereto. Therefore, a structure of the light emitting element 1000 can be deformed into other forms.

As illustrated in FIG. 14, the light emitting element 1000 includes a nanodevice 100, an electrode 300, and a power source 400. If the power source 400 is electrically connected to an upper end of the nanorod 30 by using an electrode 300 and is directly and electrically connected to the substrate 10, a light is emitted from the nanorod 30. Therefore, a light emitting element 1000 with good light efficiency can be manufactured. The light emitting diode (LED) is manufactured by using the same theory as described above. In this case, since the nanorod 30 not only has a large surface area but also has a nano-scaled contact with a substrate, light output can be maximized with a great current density even with little electric power when the same voltage is applied. In addition, since a consuming amount of the electric power of the nanodevice 100 is little, the light emitting diode can be used in a long time.

Figure 15:
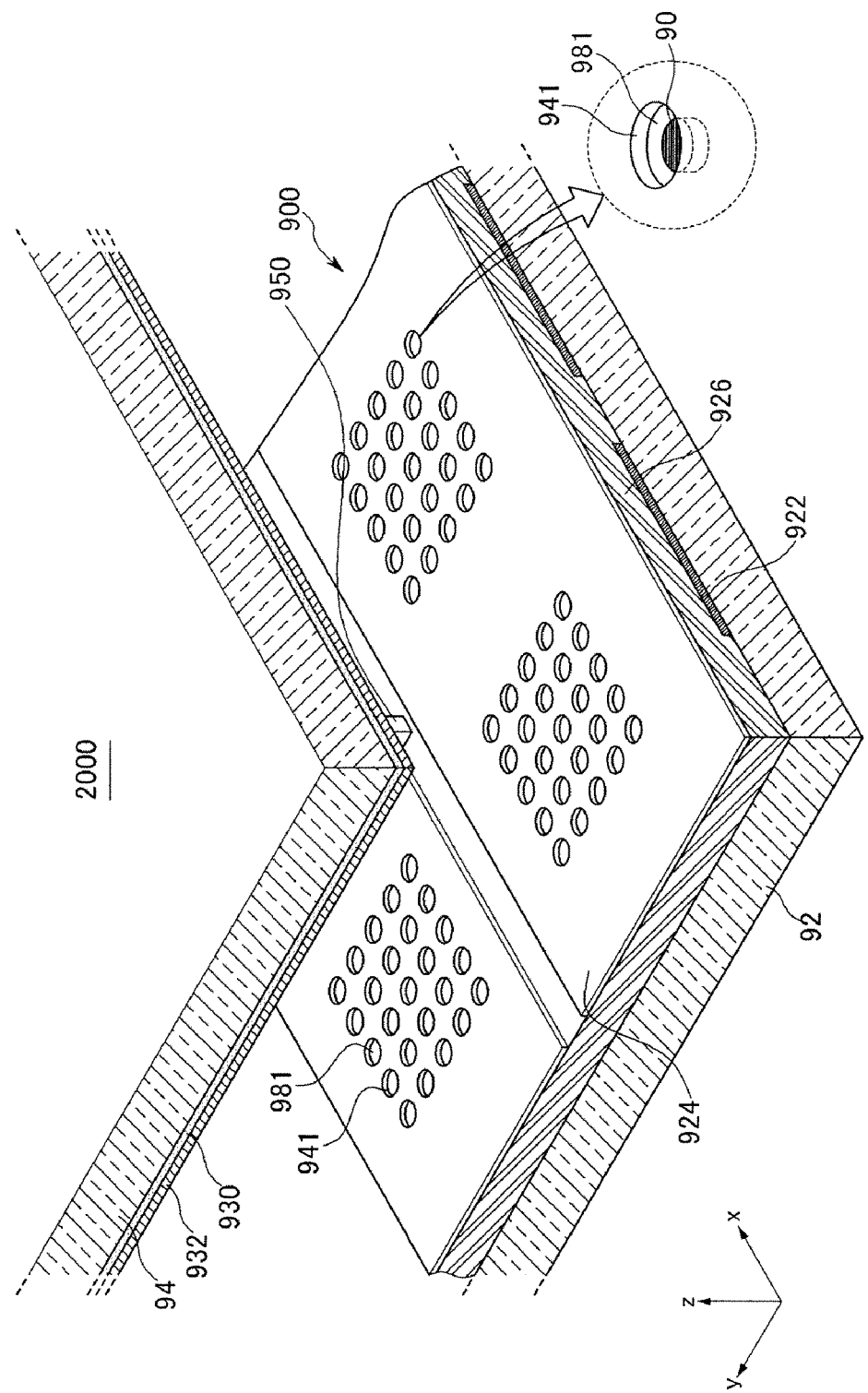
FIG. 15 is a schematic exploded view of an electron emission display including the nanodevice of FIG. 1 or FIG. 3.

FIG. 15 schematically shows an exploded electron emission display 2000 including the nanodevice 100 of FIG. 1 or the nanodevice 200 of FIG. 2. An enlarged circle of FIG. 15 shows a magnified electron emission portion 90. The nanodevices 100 and 200 can be used in an electron emission element 900 and a light emitting device 200. The light emitting device 2000 includes a display device.

As described in FIG. 15, the light emitting device 1000 includes first and second substrates 92 and 94 opposing each other. A space formed between the first and second substrates 92 and 94 is placed under vacuum at about $10^{-6}$ Torr and is then sealed. A spacer 950 is arranged between the first and second substrates 92 and 94 in order to form a space therebetween. The first and second substrates 92 and 94 can be manufactured by using transparent glass, for example.

An electron discharging element 900 includes cathodes 922, electron emission portions 90, and gate electrodes 924. An insulating layer 926 is located between the cathodes 922 and the gate electrodes 924, and thereby a short circuit between the cathodes 922 and the gate electrodes 924 is prevented.

The cathodes 922 are spaced apart from each other to be arranged on the first substrate 92. A data driving voltage is applied to each of the cathodes 922, thereby functioning as a data electrode. An electron emission portion 90 is located on a light emitting element on which the cathodes 922 and the gate electrodes 924 are overlapped with each other. The electron emission portion 90 is electrically connected to the cathode 922.

As shown in an enlarged circle of FIG. 15, openings 9261 and 9241 are formed on the insulating layer 926 and the gate electrode 924, respectively, in order for an electron emitted from the electron emission portion 90 to pass therethrough. Electrons are emitted from the electron emitting portion 90 by a voltage difference applied to the cathode 922 and the gate electrode 924.

The nanodevice 100 of FIG. 1 or the nanodevice 200 of FIG. 2, which emits electron if an electric field is applied, can be used as the electron emitting portion 90.

A phosphor layer 932 and an anode 930 are located on the second substrate 94. Since a high voltage is applied to the anode 930, electrons emitted from the nanorod of the electron emitting portion 90 are led to collide with the phosphor layer 932 at a high speed. Therefore, light is generated from the phosphor layer 932 and is then emitted outside through the second substrate 94. Since the phosphor layer 932 has a white color, the white color can be emitted outside. On the other hand, the phosphor layer 932 can be formed of a red color R, a green color G, and a blue color B, and thereby various kinds of light can be emitted.

Meanwhile, a diode can be manufactured by using the nanodevice 100 of FIG. 1 or the nanodevice 200 of FIG. 2. The nanodevice can be manufactured as a p-n junction diode by using a heterojunction method. Since the p-n junction diode has an ideal property by using the above method, it is suitable for being used.

In addition, a transistor can be manufactured by using the nanodevice 100 of FIG. 1 or the nanodevice 200 of FIG. 2. Since the nanorods extend along one direction and an interval therebetween can be controlled, a highly-integrated transistor can be easily manufactured at a low cost. Electron transferring efficiency thereof is excellent. Therefore, a transistor with excellent electric efficiency can be manufactured by using the nanorod.

The present invention will be explained in detail with reference to the exemplary example below. The exemplary example is merely to illustrate the present invention and the present invention is not limited thereto.

EXEMPLARY EXAMPLE 1

The seed layer was formed on the substrate. The seed layer made of gallium nitride was formed on the substrate made of a silicon single crystal by using metal organic chemical vapor deposition (MOCVD).

Next, amorphous silicon oxide $SiO_2$ or silicon nitride $SiN_x$ was deposited on the seed layer to pattern the seed layer. In this case, the method of plasma-enhanced chemical vapor deposition was used.

As a result, a mask layer with the thickness of about 50 nm was formed on the seed layer. A photosensitive resin was baked after it was formed on the mask layer by using a spin coating method. Polymethyl methacrylate (PMMA) was used as a material of the photosensitive resin.

The photosensitive resin was formed on the mask layer and was then heated. In addition, the photosensitive resin was exposed to a light or an electron beam with a predetermined pattern. Next, a portion of the photosensitive resin that was only exposed to the light was removed by etching with a developing liquid, and thereby a portion of the mask layer was exposed. In addition, a portion of the mask layer that was exposed was etched and then a portion of the seed layer was also exposed. Then, the photosensitive resin was removed by using an organic solution. Therefore, a seed layer with a predetermined pattern was exposed.

Figure 16:
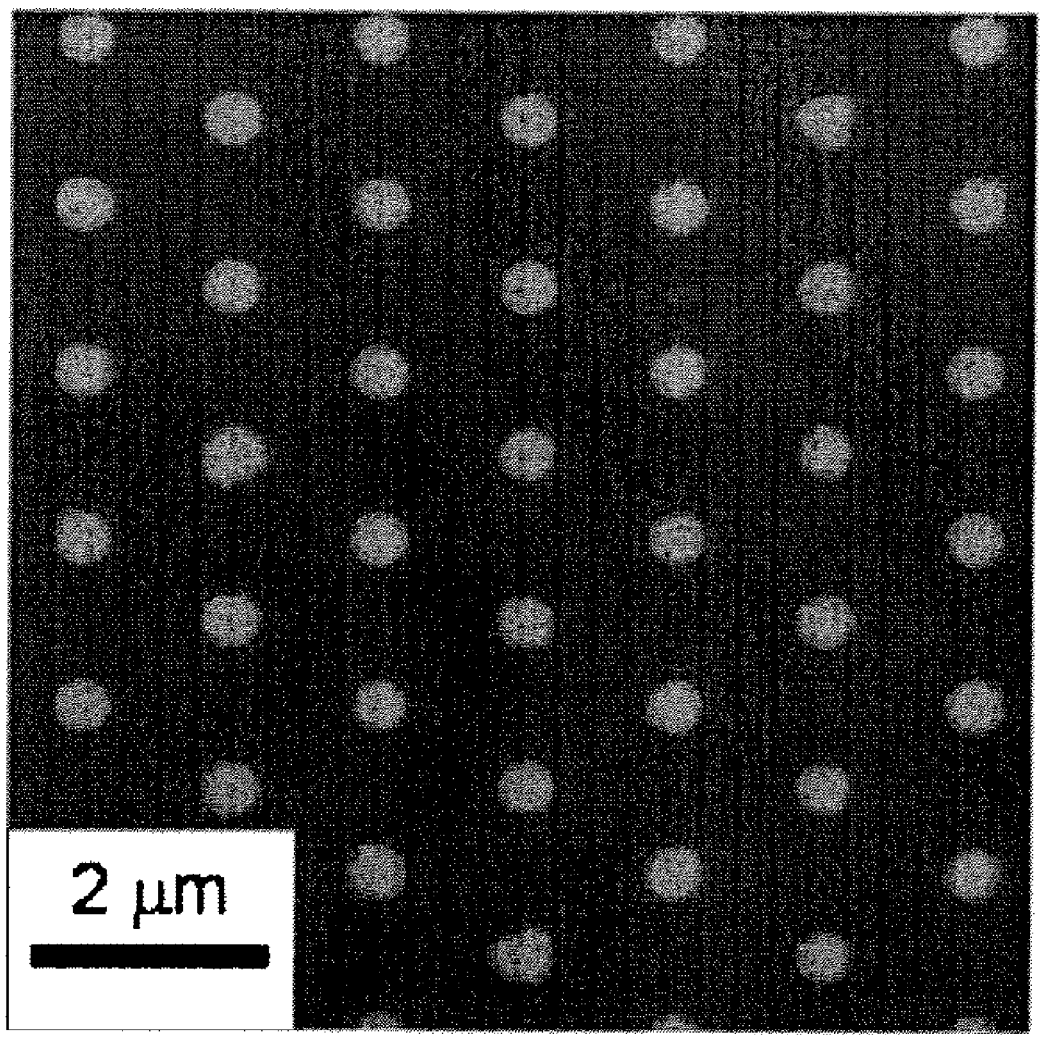
FIG. 16 is a scanning electron microscopy photograph of a mask layer manufactured according to a first Exemplary Example of the present invention.

FIG. 16 is a scanning electron microscopy photograph of a mask layer manufactured by using the above-described method. As shown in FIG. 16, the seed layer with a predetermined pattern was exposed through the opening of the mask layer.

The substrate manufactured by using the above described method was loaded into a chemical vapor deposition reactor, and was then maintained at a temperature of not more than 1000° C. for about 1 to 60 minutes. Therefore, a crystal made of gallium nitride grew on the exposed seed layer. TMGa and ammonia were used as reacting precursors. In this case, a crystal with a hexagonal cone shape was obtained and a size thereof was in a range of an order of 10 nanometers to an order of ten micrometers.

Figure 17:
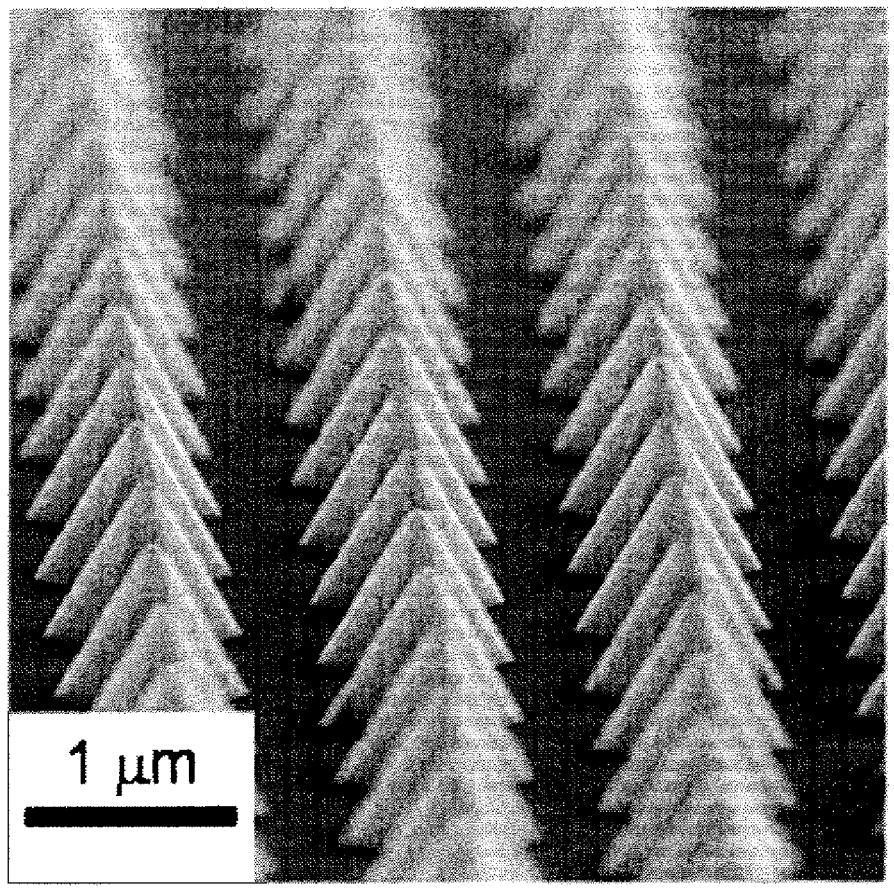
FIGS. 17 and 18 are a tilt-view scanning electron microscopy photograph and a plan-view scanning electron microscopy photograph of a crystal manufactured according to a first Exemplary Example of the present invention, respectively.

FIG. 17 shows a tilt-view scanning electron microscopy photograph of a crystal manufactured by using the above-described method. As shown in FIG. 17, it can be confirmed that the crystal has a shape of a pyramid or a cone. A plurality of crystals are spaced apart from each other to be regularly arranged along one direction.

Figure 18:
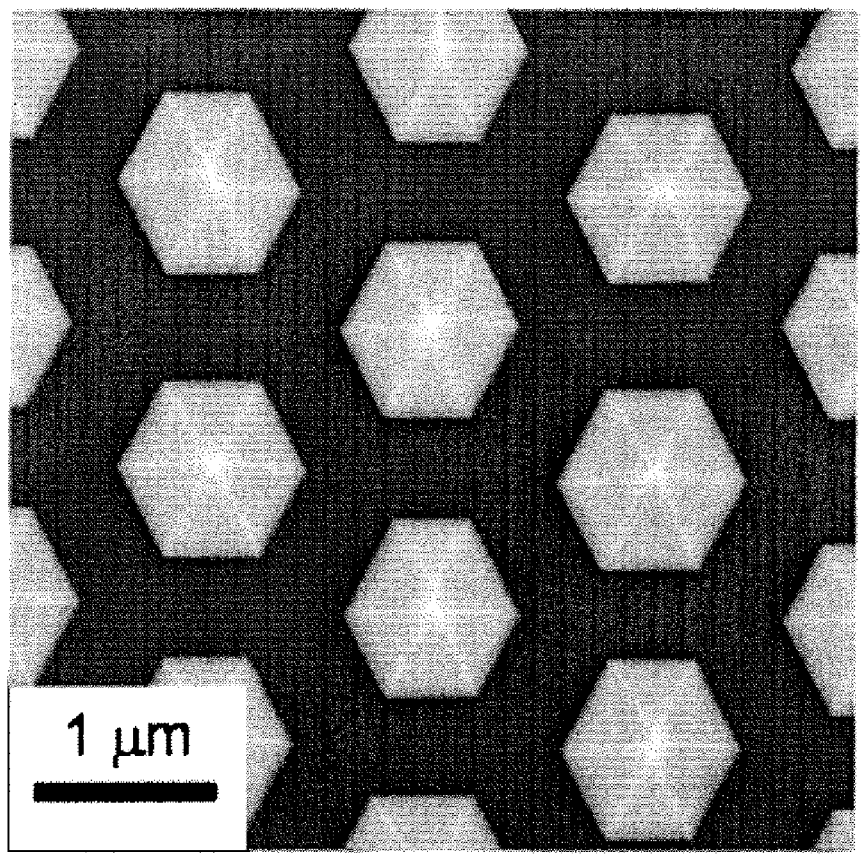

FIG. 18 shows a plan-view scanning electron microscopy photograph of a crystal. As shown in FIG. 18, since a cross-section of the crystal has a hexagonal shape, it shows a shape such as of a honeycomb. That is, the crystals are not attached to each other to be spaced apart from each other.

Next, a nanorod made of zinc oxide was formed on the crystal by using metal organic chemical vapor deposition. The nanorod was formed to extend along a direction to be substantially perpendicular to the substrate. Since gallium nitride as a material of the crystal and zinc oxide as a material of the nanorod have the same crystal structure and have anisotropic energy, and a difference of the lattice parameter therebetween is small such as 1.9%, they are suitable for being manufactured as the nanodevice.

Figure 19:
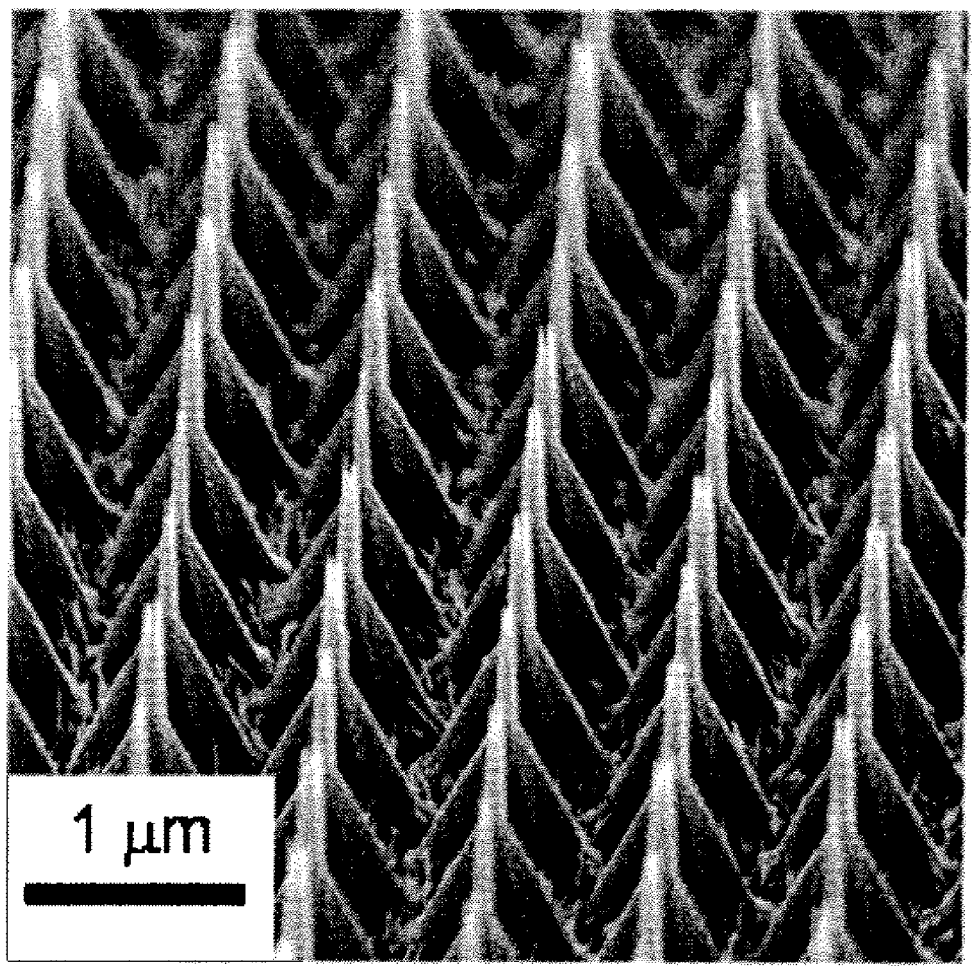
FIGS. 19 and 20 are a tilt-view scanning electron microscopy photograph and a plan-view scanning electron microscopy photograph measured by electron microscopy photography of a nanodevice according to a first Exemplary Example of the present invention, respectively.

FIG. 19 shows a tilt-view scanning electron microscopy photograph of the nanodevice manufactured by using the above described method. As shown in FIG. 19, it can be known that the nanorod is formed on the crystal with a hexagonal cone shape.

Figure 20:
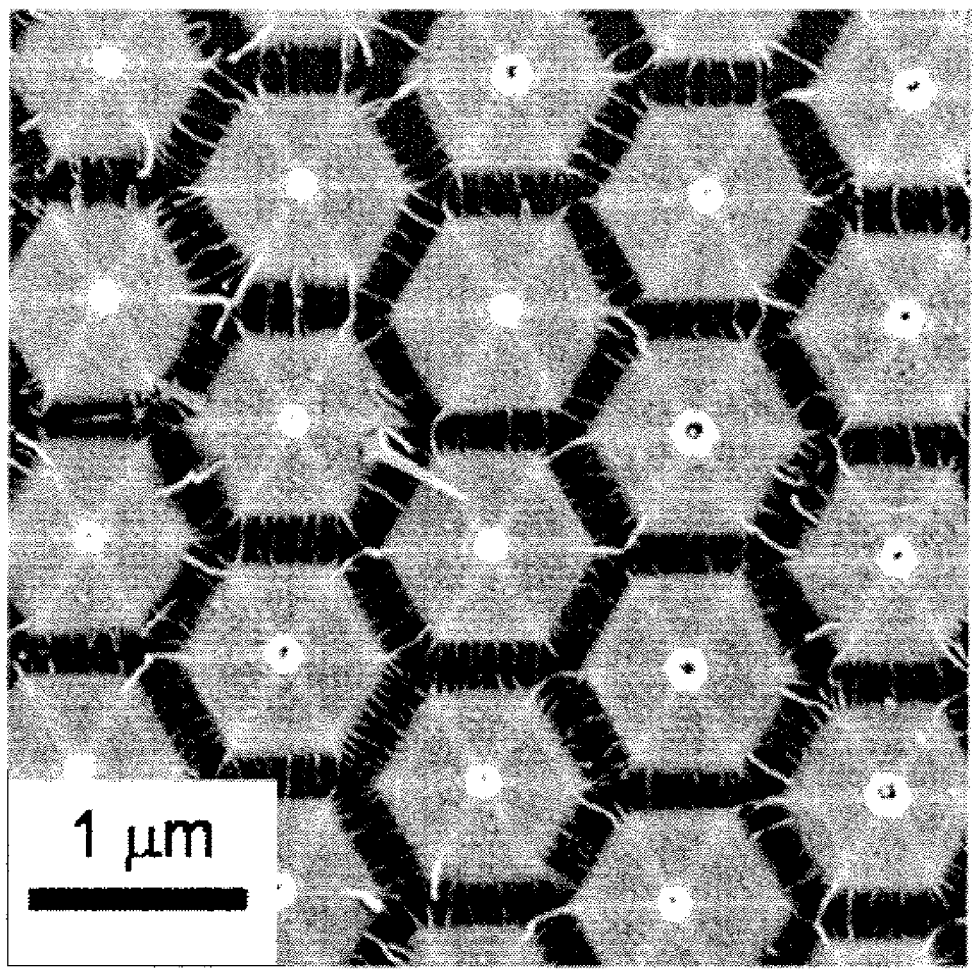

FIG. 20 shows a plan-view scanning electron microscopy photograph of the nanodevice. As shown in FIG. 20, the nanorod was formed on a center of a crystal with a hexagonal cone shape.

Figure 21:
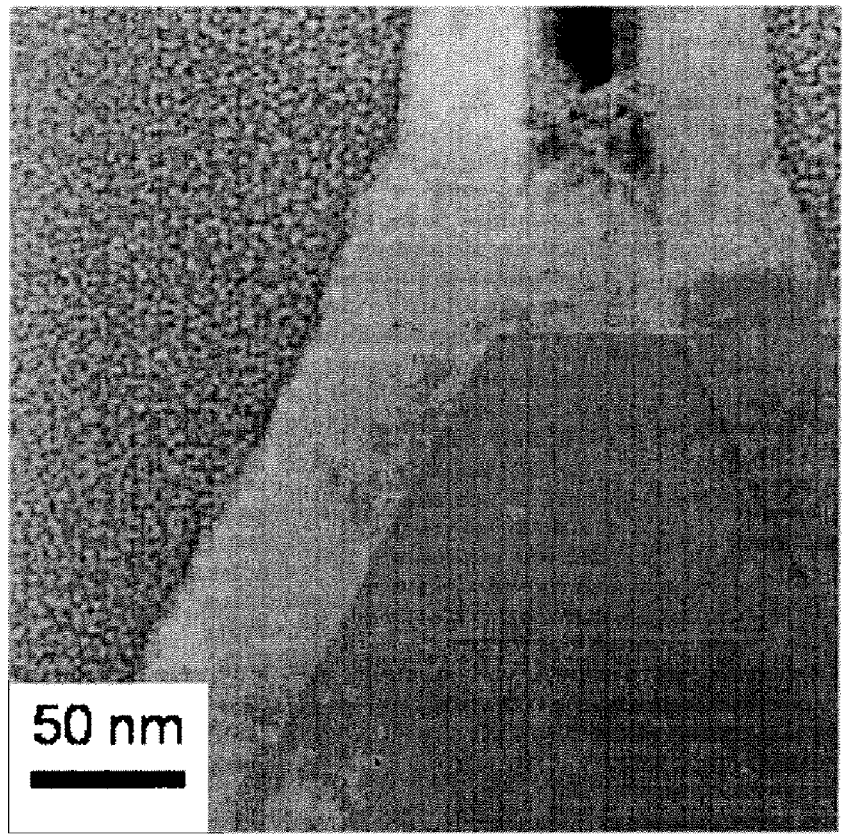
FIG. 21 is a transmission electron microscopy photograph of a cross-section of the nanodevice of FIG. 19 cutting along a longitudinal direction of a nanorod.

FIG. 21 is a cross-section photograph of the nanodevice of FIG. 19 cutting along a longitudinal direction of a nanorod. As shown in FIG. 21, it could be confirmed that the nanorod was formed on the crystal with a hexagonal cone shape as a solid body and a trapezoid shape as a cross-section. The nanorod grew only on the crystal and a thin film was formed on other surfaces of the crystal.

The crystal of the nanorod was analyzed in order to examine an epitaxial relationship between the crystal structure of the nanorod and the crystal manufactured by using the above-described method by using a high resolution X-ray diffractor and a high resolution radiation light X-ray diffractor.

Figure 22:
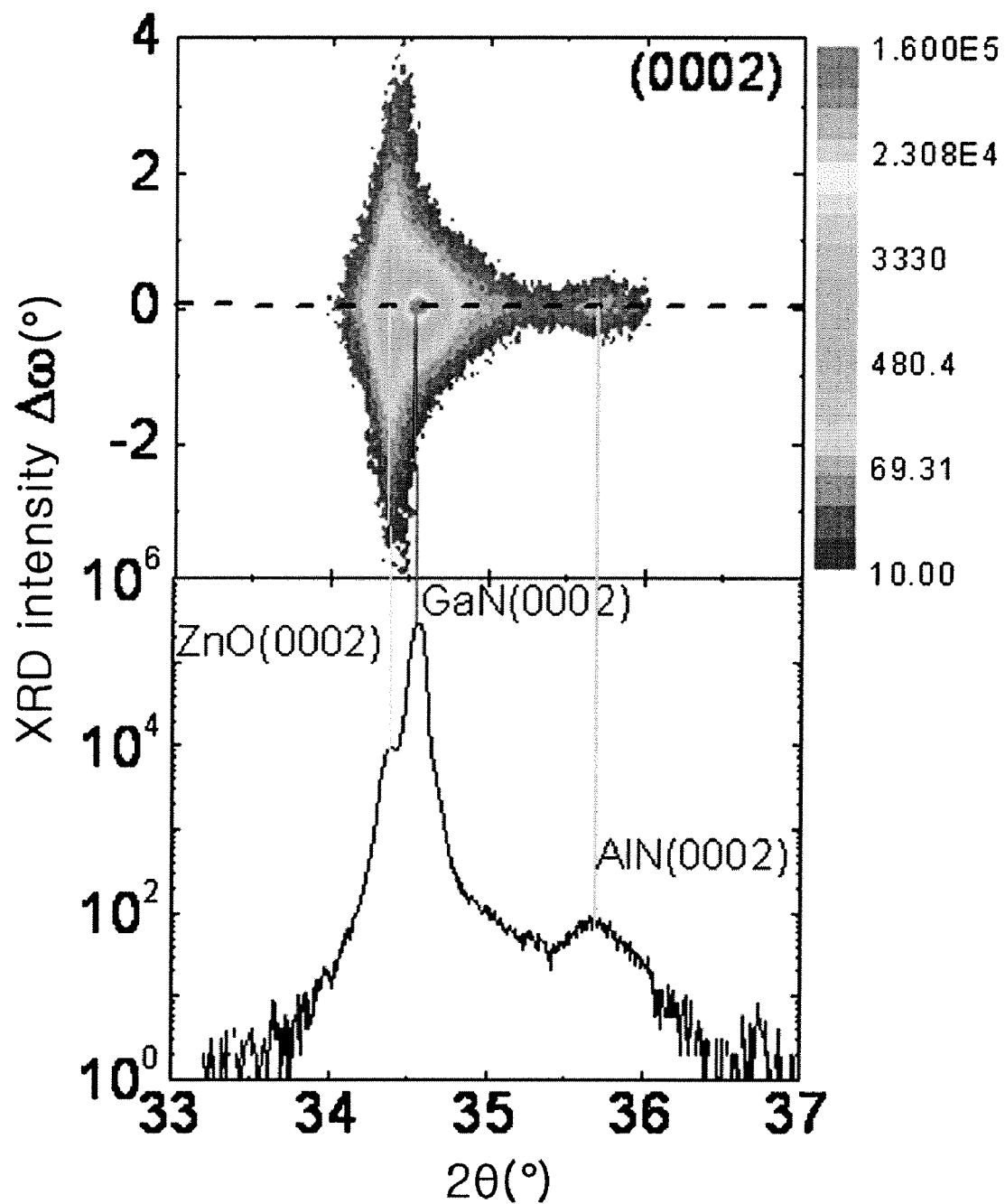
FIG. 22 is a graph that shows an epitaxial relationship between the crystal and the nanorod.

FIG. 22 is a graph that shows an epitaxial relationship between the crystal and the nanorod. An upper portion of FIG. 22 shows a reverse lattice space phenomenon while a lower portion thereof shows X-ray intensity.

As shown in the lower portion of FIG. 22, both the crystal made of gallium nitride (GaN) and the nanorod made of zinc oxide (ZnO) are oriented along the (0002) crystal direction. In addition, diffraction peaks of the crystal and the nanorod are spaced apart from each other to be well-separated from each other.

In addition, as shown in the upper portion of FIG. 22, as a result of measuring the reverse lattice space phenomenon in the upper portion of the graph, the diffraction peaks of the crystal and the nanorod are observed at a point where $\Delta\omega$ is 0 degrees (shown as a black dotted line). This means that the (0002) direction of the nanorod that is vertically oriented is the same as that of the crystal.

Figure 23:
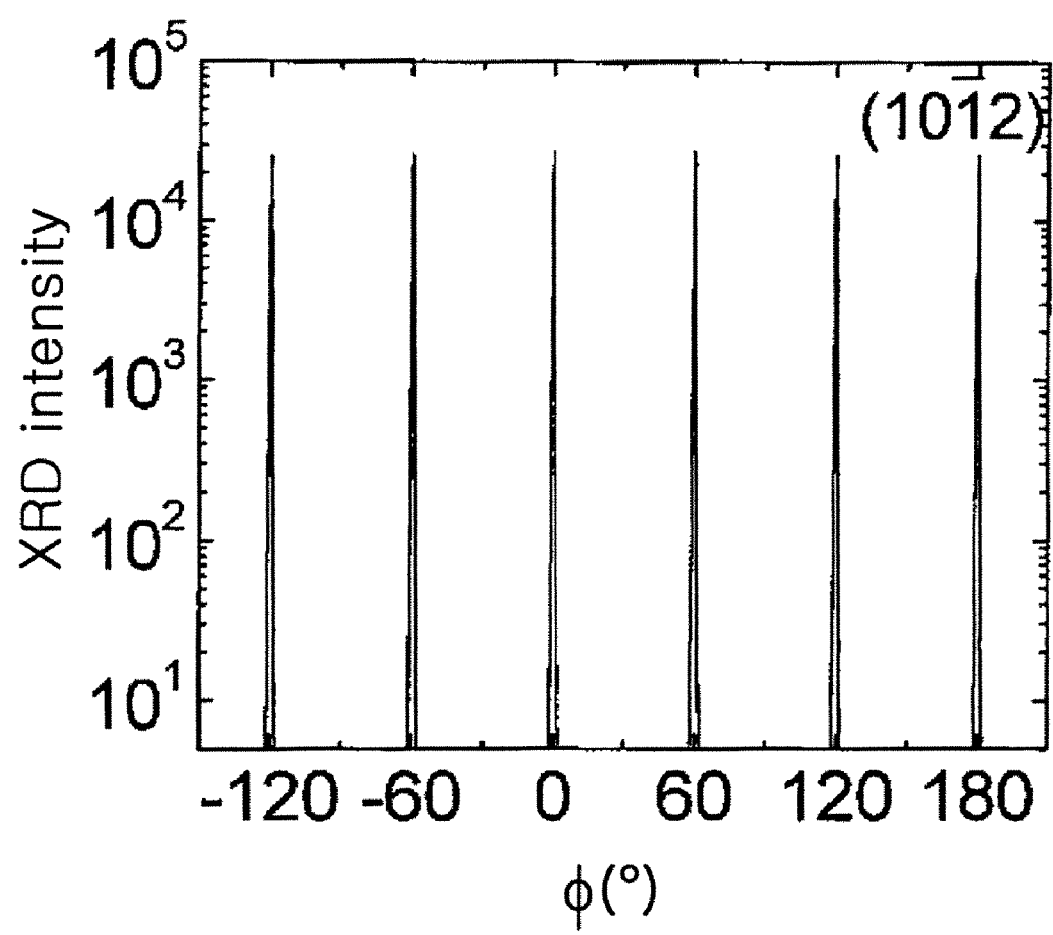
FIGS. 23 and 24 are X-ray diffraction graphs of an epitaxial relationship between the crystal and the nanorod.

FIG. 23 shows an X-ray diffraction graph of the nanorod grown on the crystal.

As shown in FIG. 23, six peaks corresponding to the $\{10\bar{1}2\}$ plane were observed when an azimuth is rotated 360 degrees at a $\{10\bar{1}2\}$ diffraction peak of the nanorod. This means that the nanorod has a uniform six-fold rotational symmetry. That is, the nanorod was uniformly grown with an epitaxial relationship.

Figure 24:
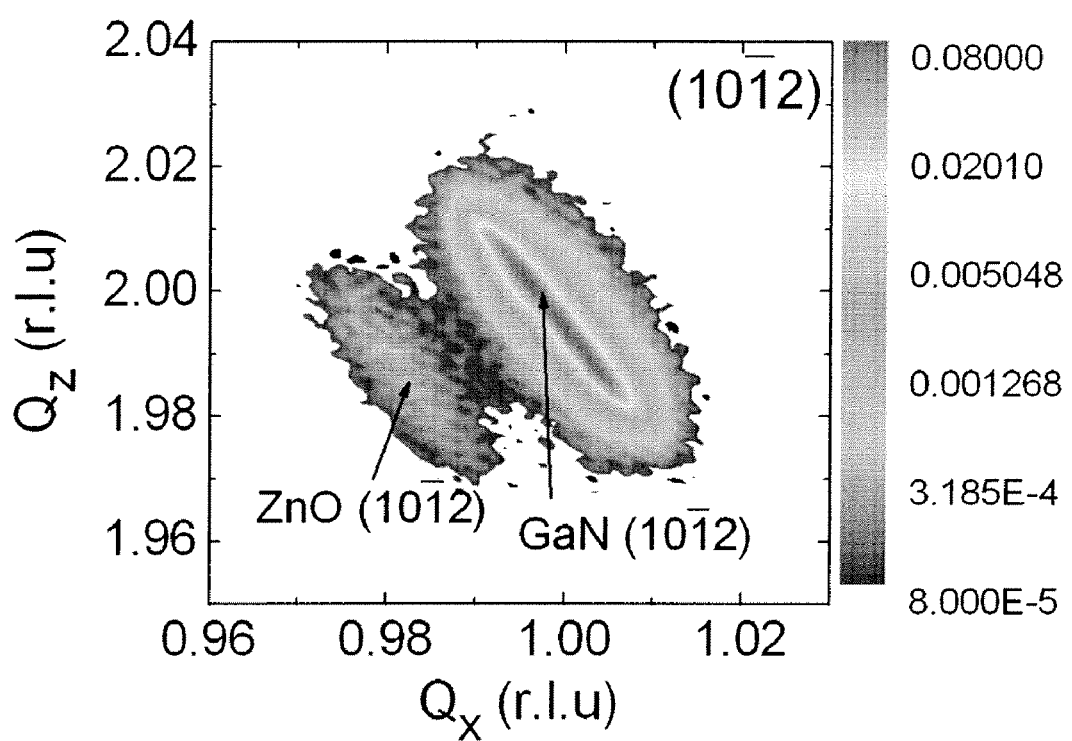

FIG. 24 shows a reverse lattice space phenomenon near the $(10\bar{1}2)$ diffraction peak of the nanorod grown on the crystal. As shown in FIG. 24, $(10\bar{1}2)$ diffraction peaks of the nanorod made of zinc oxide and the crystal made of gallium nitride were simultaneously measured. This means that the nanorod grew with epitaxy on the crystal.

Therefore, it could be confirmed that the nanorod grew on the crystal with a hetero epitaxy. In addition, it could be confirmed that the nanorod grew only on a certain plane with anisotropic surface energy. That is, the nanorod grew only on a plane whose surface lattice structure corresponds thereto or is most similar thereto among all the planes of the crystal and a shape of a thin film was formed in the rest of the planes. The nanorod grew along a (0001) direction on a (0001) plane of the crystal while not the nanorod but the thin film was formed on a $\{10\bar{1}1\}$ plane or $\{10\bar{1}0\}$ plane. That is, the nanorod grew only on a (0001) plane of the crystal with the most similar surface lattice structure. This can be confirmed in the above-described photograph of FIG. 19.

Figure 25:
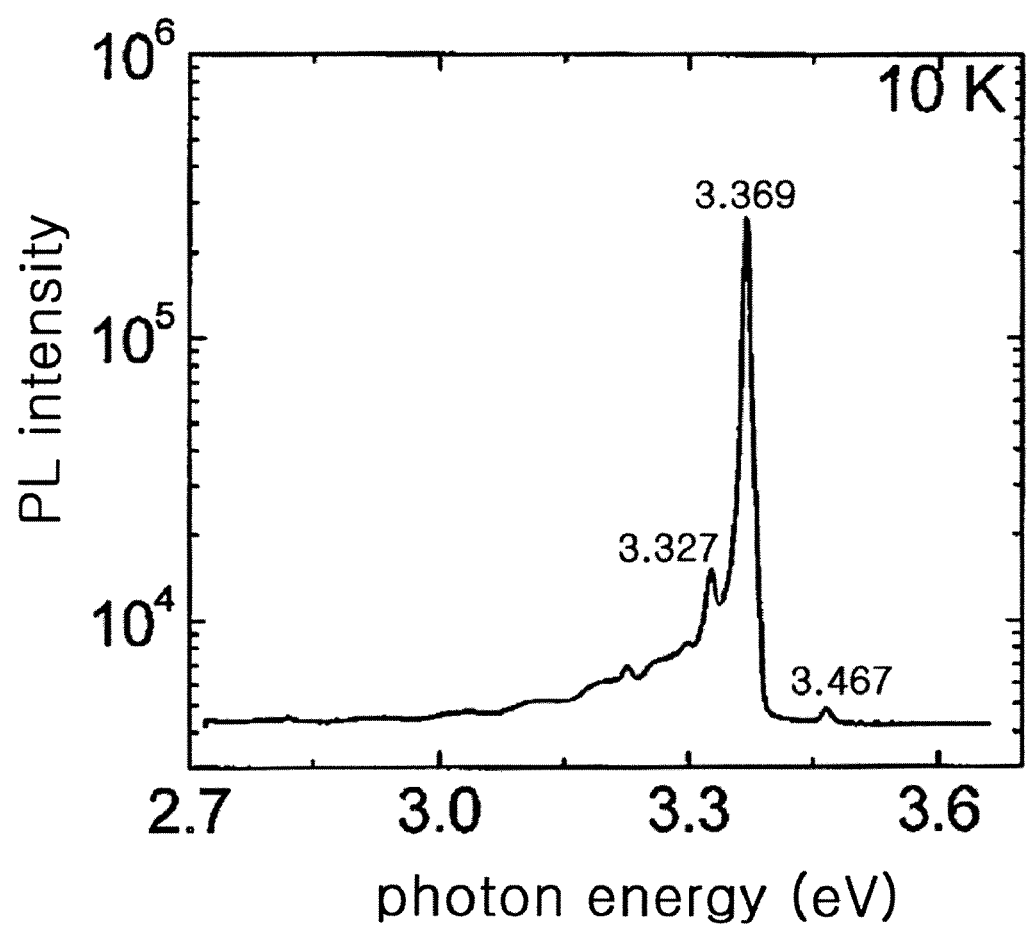
FIG. 25 is a graph showing a result of measuring an optical characteristic of a nanodevice by a low temperature photoluminescence spectrum measurement.

FIG. 25 is a graph showing a result of measuring an optical characteristic of a nanodevice according to a low temperature photoluminescence spectrum measurement. Here, a low temperature means 10K.

As described in FIG. 25, three main peaks were observed at an energy location of 3.327 eV, 3.369 eV, and 3.467 eV by the result of a photoluminescence spectrum. Here, the peak of 3.467 eV is illuminated by the exciton combined with a neutral donor in the crystal. In addition, peaks of 3.327 eV and 3.369 eV are illuminated from the nanorods by excitons combined with the neutral donor or the neutral acceptor, respectively.

Figure 26:
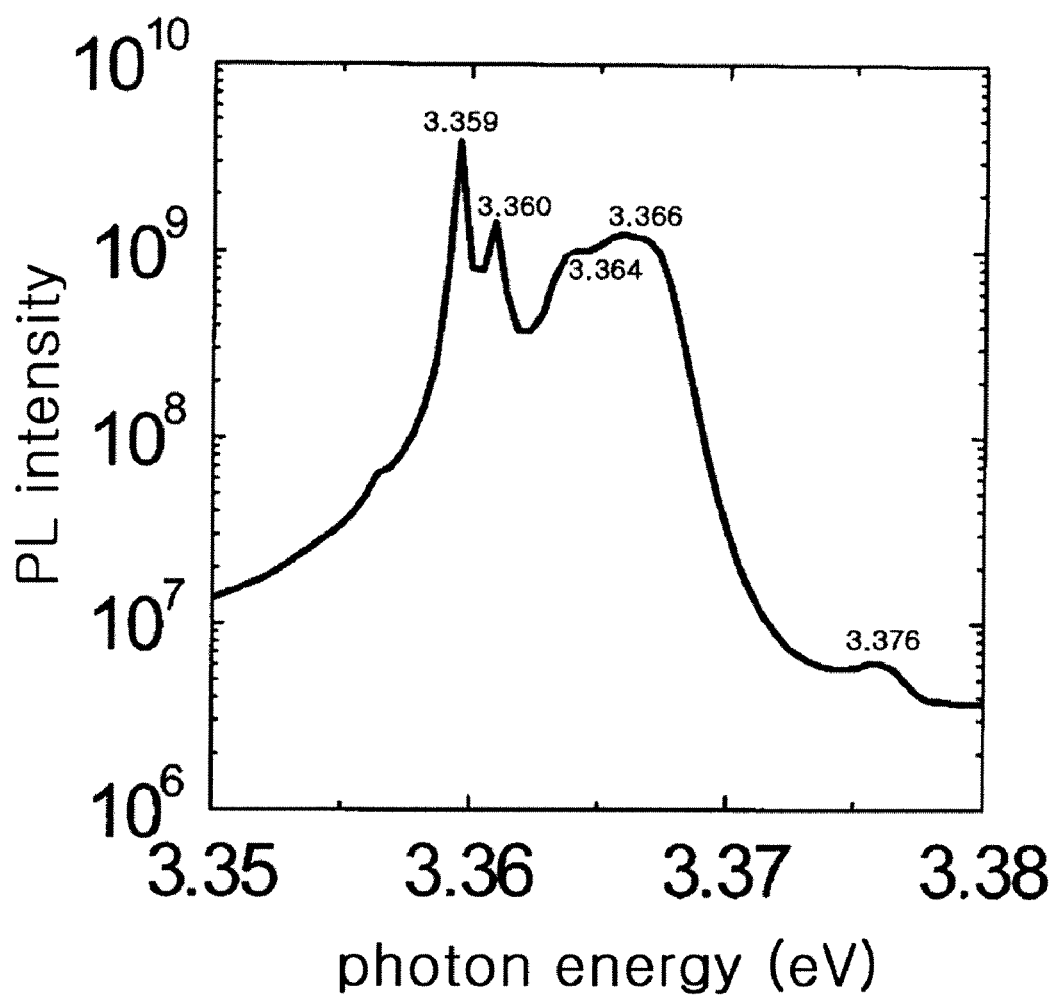
FIG. 26 is a graph magnifying a peak of 3.369 eV of FIG. 25 by high resolution monochromator.

FIG. 26 is a graph analyzing and magnifying a peak of 3.369 eV of FIG. 25 by a high resolution monochromator.

As shown in FIG. 26, 3.369 eV was clearly shown to be divided into five peaks of 3.359 eV, 3.360 eV, 3.364 eV, 3.366 eV, and 3.376 eV. Here, all of the illumination peaks at 3.359 eV, 3.360 eV, 3.364 eV, and 3.366 eV are illuminated by excitons combined with a neutral donor of zinc oxide. In addition, an illumination peak at 3.376 eV is illuminated by a free exciton.

As describe above, facts that excitons combined with a neutral donor which is divided well are observed and free excitons are observed at a low temperature of 10K mean that the nanorod is not only highly pure but also has excellent crystallographic and optical properties. Therefore, a nanorod with a good physical property can be manufactured by using an organic metal chemical vapor deposition method without using a catalyst.

EXEMPLARY EXAMPLE 2

A nanodevice was manufactured by using a method that is the same as that of the above-described Exemplary Example 1, except for the temperature for forming a nanorod in the organic metal chemical vapor deposition reactor. A crystal with a hexagonal column shape was manufactured by maintaining a temperature of a range of about 800° C. to 1000° C. in the organic metal chemical vapor deposition reactor. Not only a crystal with a hexagonal column shape but also a crystal with a hexagonal cone shape can be obtained.

Figure 27:
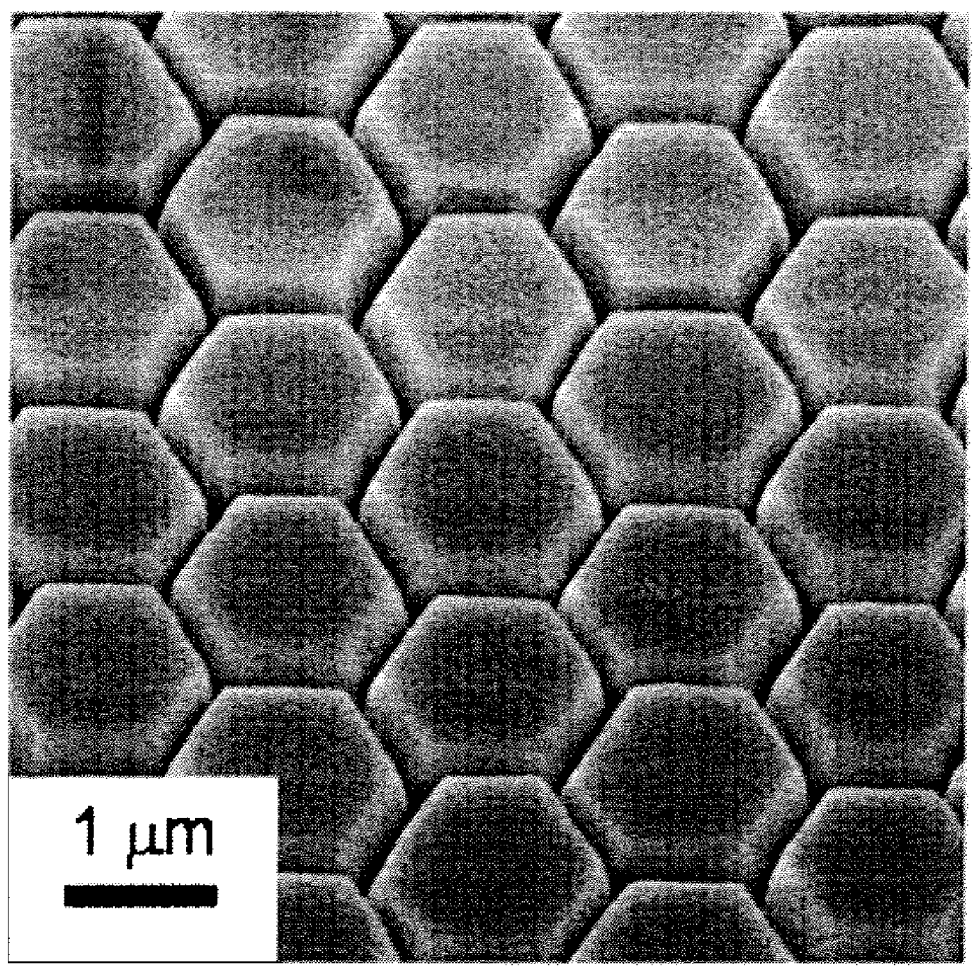
FIG. 27 is a tilt-view scanning electron microscopy photograph of a crystal manufactured according to a second Exemplary Example of the present invention.

FIG. 27 shows a tilt-view scanning electron microscopy photograph of a crystal manufactured according to a second Exemplary Example of the present invention. As shown in FIG. 27, a plurality of crystals, which are spaced apart from each other, can be manufactured. Each of the crystals has a hexagonal column shape.

Figure 28:
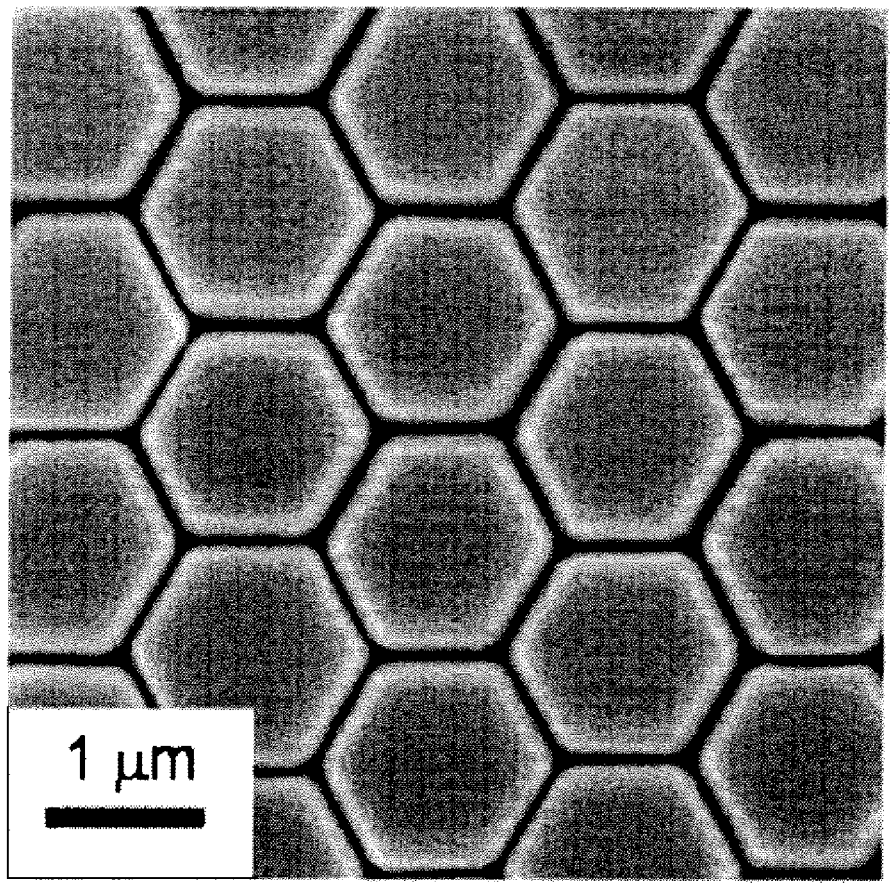
FIG. 28 is a plan-view scanning electron microscopy photograph of a crystal of FIG. 27.

FIG. 28 shows a scanning electron microscopy photograph of a cross-section of a crystal of FIG. 27. As described in FIG. 28, each of the crystal has a cross-sectional structure of a hexagon shape. Therefore, entire cross-sectional structure has a honeycomb shape.

A nanorod made of zinc oxide was formed on the crystal by using an organic metal chemical vapor deposition method. The nanorod was formed to extend along a direction to be substantially perpendicular to a substrate.

Figure 29:
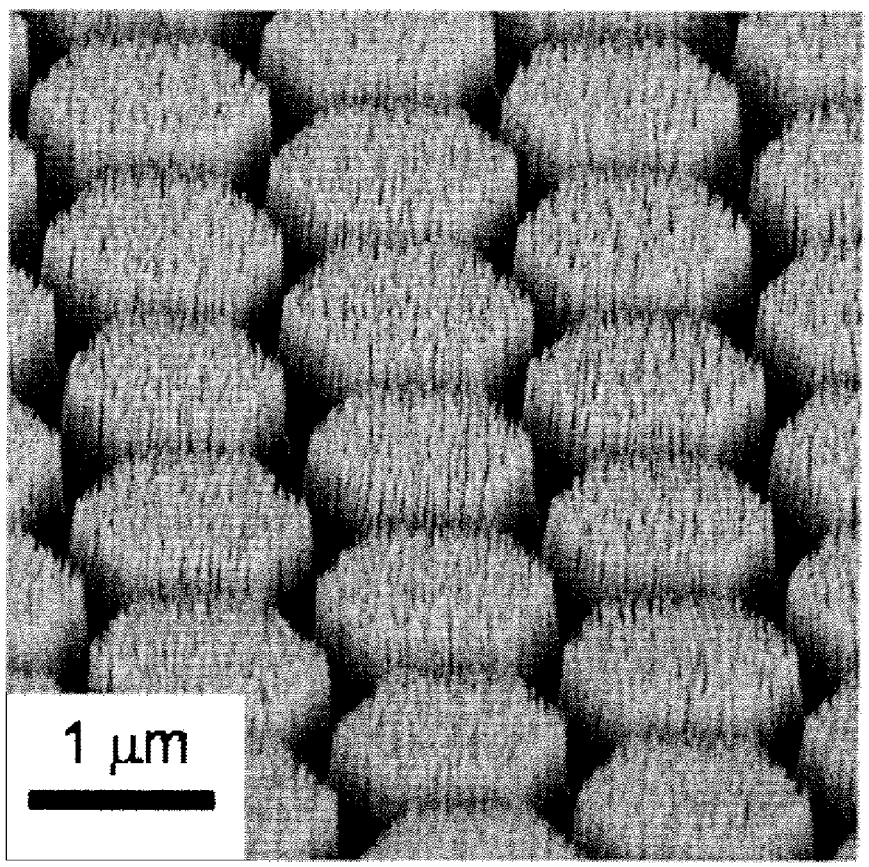
FIG. 29 is a tilt-view scanning electron microscopy photograph of a nanodevice provided with nanorods.

FIG. 29 shows a tilt-view scanning electron microscopy photograph of a nanodevice provided with nanorods that are formed to extend along a vertical direction. As shown in FIG. 29, a plurality of nanorods were formed to extend along a vertical direction on a crystal with a hexagonal column shape. Since the crystals were spaced part from each other, the plurality of nanorods formed thereon are also formed to be spaced apart from each other for each of the crystals.

Figure 30:
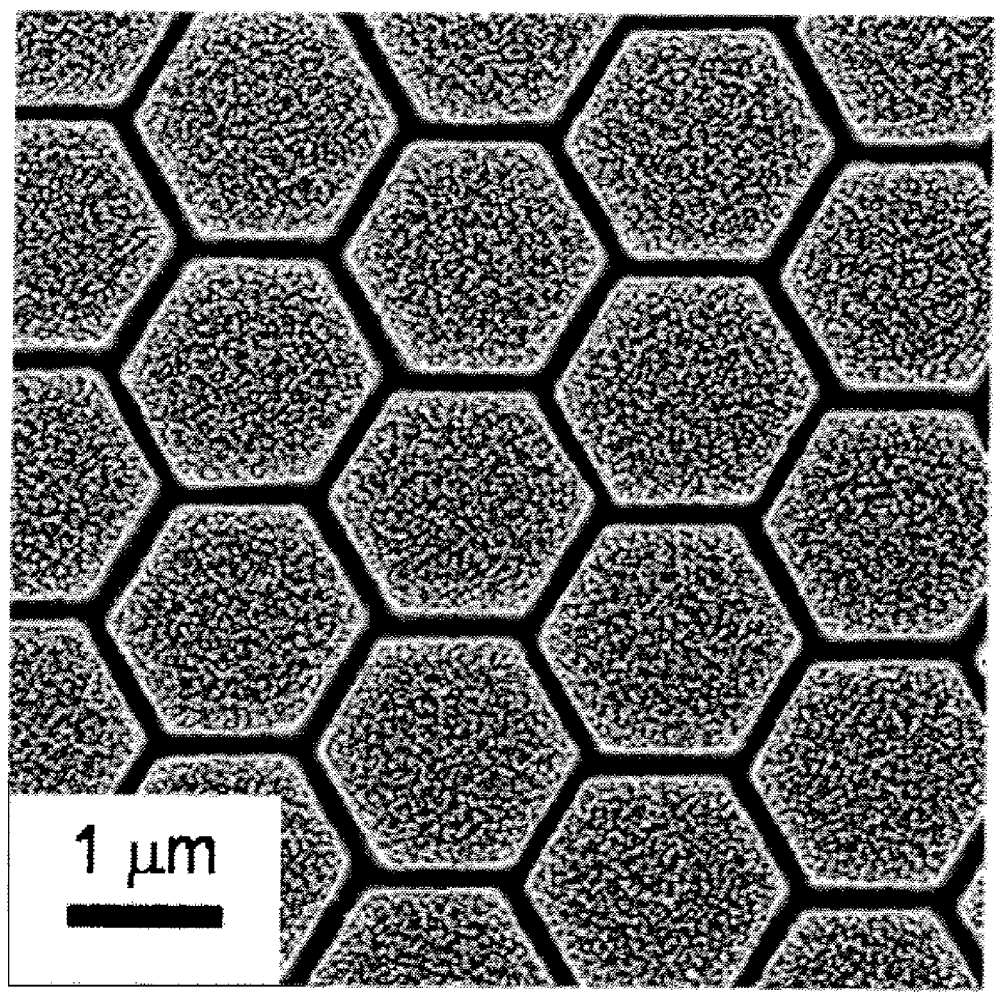
FIG. 30 is a plan-view scanning electron microscopy photograph of a nanodevice manufactured according to a second Exemplary Example of the present invention.

FIG. 30 shows a plan-view scanning electron microscopy photograph of a cross-section of the nanodevice manufactured according to the second Exemplary Example of the present invention. As shown in FIG. 30, it could be observed that a plurality of nanorods were formed on each of the crystals with a hexagonal column shape. That is, comparing FIG. 28 in which only crystals grew with FIG. 30 in which the nanorods grew, it could be observed that the plurality of nanorods were formed on the crystal.

The nanodevice manufactured according to the second Exemplary Example of the present invention has the same physical properties as those of the nanodevice manufactured according to the first Exemplary Example of the present invention.

While the present invention has been particularly shown and described with reference to exemplary embodiments thereof, it will be understood by those skilled in the art that various changes in form and detail may be made therein without departing from the spirit and scope of the invention as defined by the appended claims.

What is claimed is:

1. A nanodevice comprising:
   a substrate;
   a plurality of crystals located on the substrate and spaced apart from each other; and
   a plurality of nanorods respectively located on the plurality of crystals and extending along a substantially perpendicular direction to a surface of the substrate,
   wherein each of the plurality of crystals comprise a plurality of side surfaces,
   distances between crystals neighboring each other along one direction among the plurality of crystals are substantially the same,
   the plurality of crystals are selected from the group consisting of silicon, aluminum oxide, gallium arsenide, spinel, indium phosphide, gallium phosphide, aluminum phosphide, gallium nitride, indium nitride, aluminum nitride, magnesium oxide, silicon carbide, and titanium oxide, and
   the plurality of nanorods are selected from the group consisting of zinc oxide (ZnO), zinc magnesium oxide (ZnMgO), zinc cadmium oxide (ZnCdO), zinc beryllium oxide (ZnBeO), and zinc magnesium beryllium oxide (ZnMgBeO).

2. The nanodevice of claim 1, wherein a cross-section of a crystal cutting along a direction to be parallel to the surface of the substrate becomes smaller moving closer to the plurality of nanorods.

3. The nanodevice of claim 2, wherein an average cross-sectional area of the crystal cutting along the direction parallel to the surface of the substrate is not less than a cross-sectional area of a nanorod cutting along the direction parallel to the surface of the substrate.

4. The nanodevice of claim 1, further comprising:
   a seed layer that is located between the substrate and the plurality of crystals, and the seed layer comprises a same material to the substrate.

5. The nanodevice of claim 4, wherein the plurality of crystals are grown from the seed layer.

6. The nanodevice of claim 4, further comprising:
   a mask layer covering the seed layer, and having a plurality of openings,
   wherein the plurality of crystals are formed to cover the plurality of openings, respectively.

7. The nanodevice of claim 1, wherein at least one side surface among the plurality of side surfaces is a slanted surface.

8. The nanodevice of claim 7, wherein a shape of at least one of the plurality of crystals is a frustum of a pyramid or a pyramid.

9. The nanodevice of claim 7, wherein the slanted surface forms an angle in a range of about 10 to 90 degrees with the surface of the substrate.

10. The nanodevice of claim 1, wherein the plurality of nanorods extend along a center axis of the plurality of crystals.

11. The nanodevice of claim 1, wherein angles between the side surfaces neighboring each other among the plurality of side surfaces are substantially the same.

12. The nanodevice of claim 1, wherein the plurality of side surfaces extend along a direction substantially perpendicular to the surface of the substrate, and the plurality of crystal comprise an upper surface that neighbors the plurality of side surfaces and is substantially parallel to the surface of the substrate.

13. The nanodevice of claim 12, wherein the plurality of nanorods have a bundle shape and are formed on the each upper surface of the plurality of crystals.

14. The nanodevice of claim 1, wherein the numbers of side surfaces is in a range of 3 to 612.

15. The nanodevice of claim 1, wherein growing directions of the plurality of crystals and the plurality of nanorods are substantially the same.

16. The nanodevice of claim 1, wherein the nanodevice is used as a light emitting element, an electron emitting element, a diode, or a transistor.

* * * * *